(12) United States Patent
Nishikawa et al.

(10) Patent No.: US 11,353,750 B2
(45) Date of Patent: Jun. 7, 2022

(54) OPTICALLY ANISOTROPIC FILM COMPRISING AN ABSORPTION INTENSITY RATIO OF 1.02 OR MORE, LAMINATE, CIRCULARLY POLARIZING PLATE, AND DISPLAY DEVICE

(71) Applicant: FUJIFILM Corporation, Tokyo (JP)

(72) Inventors: Hideyuki Nishikawa, Kanagawa (JP); Ryoji Goto, Kanagawa (JP); Yuuta Fujino, Kanagawa (JP); Mirei Arayasu, Kanagawa (JP); Yuki Nakamura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 17/400,752

(22) Filed: Aug. 12, 2021

(65) Prior Publication Data

US 2021/0382348 A1    Dec. 9, 2021

Related U.S. Application Data

(63) Continuation of application No. PCT/JP2020/007805, filed on Feb. 26, 2020.

(30) Foreign Application Priority Data

Feb. 27, 2019    (JP) .............................. JP2019-034593

(51) Int. Cl.
*G02F 1/13363* (2006.01)
*G02F 1/1335* (2006.01)
(Continued)

(52) U.S. Cl.
CPC ...... *G02F 1/13363* (2013.01); *C09K 19/3809* (2013.01); *G02F 1/133541* (2021.01);
(Continued)

(58) Field of Classification Search
CPC ......... G02F 1/133541; G02F 2201/083; G02F 2202/02; G02F 2413/01; G02F 1/133632
See application file for complete search history.

(56) References Cited

U.S. PATENT DOCUMENTS

2009/0066886 A1\* 3/2009 Shimizu ............ G02F 1/133528
349/96
2010/0007828 A1\* 1/2010 Nimura ............. G02F 1/133632
156/60

(Continued)

FOREIGN PATENT DOCUMENTS

JP    2008-273925 A    11/2008
JP    2018-025770 A    2/2018
(Continued)

OTHER PUBLICATIONS

International Search Report issued in PCT/JP2020/007805 dated May 26, 2020.
(Continued)

*Primary Examiner* — Paul C Lee
(74) *Attorney, Agent, or Firm* — Edwards Neils LLC; Jean C. Edwards, Esq.

(57) ABSTRACT

Provided is an optically anisotropic film exhibiting reverse wavelength dispersibility with excellent thickness-direction phase differences, a laminate, a circularly polarizing plate, and a display device. The optically anisotropic film of an embodiment of the present invention satisfies the following Requirements 1 to 4. Requirement 1: In a case of irradiation with P-polarized light and S-polarized light, which are linearly polarized light perpendicular to each other, from a direction inclined by 45° from a normal direction of a film surface of the optically anisotropic film, an absorption intensity ratio in a case of irradiation with S-polarized light to an absorption intensity in a case of irradiation with P-polarized light is 1.02 or more in an absorption intensity (Continued)

at a wavelength having a largest absorption in a wavelength range of 700 to 900 nm. Requirement 2: Re(550)<10 nm, Requirement 3: Re(800)<10 nm. Requirement 4: Rth(450)/Rth(550)<1.

20 Claims, 4 Drawing Sheets

(51) Int. Cl.
*C09K 19/38* (2006.01)
*G02F 1/1337* (2006.01)
(52) U.S. Cl.
CPC .. *G02F 1/133711* (2013.01); *G02F 2201/083* (2013.01); *G02F 2202/02* (2013.01)

(56) References Cited

U.S. PATENT DOCUMENTS

| | | | |
|---|---|---|---|
| 2010/0045901 A1 | 2/2010 | Uehira et al. | |
| 2012/0236234 A1* | 9/2012 | Ishiguro | G02B 5/22 349/96 |
| 2015/0036086 A1* | 2/2015 | Iwasaki | G02F 1/133632 349/99 |
| 2017/0023717 A1* | 1/2017 | Hatanaka | G02B 5/3016 |
| 2019/0382555 A1 | 12/2019 | Matsumura et al. | |
| 2020/0013835 A1 | 1/2020 | Muramatsu et al. | |
| 2020/0079885 A1 | 3/2020 | Tamura et al. | |
| 2020/0140758 A1 | 5/2020 | Shimamura et al. | |
| 2020/0140759 A1 | 5/2020 | Shimamura et al. | |
| 2020/0174171 A1 | 6/2020 | Nishikawa et al. | |
| 2021/0026062 A1 | 1/2021 | Sato et al. | |

FOREIGN PATENT DOCUMENTS

| | | |
|---|---|---|
| WO | 2018/020861 A1 | 2/2018 |
| WO | 2018/159235 A1 | 9/2018 |
| WO | 2018/174015 A1 | 9/2018 |
| WO | 2018/216812 A1 | 11/2018 |
| WO | 2019/017444 A1 | 1/2019 |
| WO | 2019/017445 A1 | 1/2019 |
| WO | 2019/044859 A1 | 3/2019 |
| WO | 2019/189809 A1 | 10/2019 |

OTHER PUBLICATIONS

Written Opinion issued in PCT/JP2020/007805 dated May 26, 2020.
International Preliminary Report on Patentability completed by WIPO on Aug. 25, 2021 in connection with International Patent Application No. PCT/JP2020/007805.

* cited by examiner

OPTICALLY ANISOTROPIC FILM COMPRISING AN ABSORPTION INTENSITY RATIO OF 1.02 OR MORE, LAMINATE, CIRCULARLY POLARIZING PLATE, AND DISPLAY DEVICE

CROSS-REFERENCE TO RELATED APPLICATIONS

This application is a Continuation of PCT International Application No. PCT/JP2020/007805 filed on Feb. 26, 2020, which was published under PCT Article 21(2) in Japanese, and which claims priority under 35 U.S.C. § 119(a) to Japanese Patent Application No. 2019-034593 filed on Feb. 27, 2019. The above applications are hereby expressly incorporated by reference, in their entirety, into the present application.

BACKGROUND OF THE INVENTION

1. Field of the Invention

The present invention relates to an optically anisotropic film, a laminate, a circularly polarizing plate, and a display device.

2. Description of the Related Art

A phase difference film having refractive index anisotropy (optically anisotropic film) has been applied to various uses such as an antireflection film of a display device, and an optical compensation film of a liquid crystal display device.

In recent years, an optically anisotropic film exhibiting reverse wavelength dispersibility has been studied (JP2008-273925A). In addition, the reverse wavelength dispersibility means "negative dispersion" characteristics showing an increase in a birefringence in accordance with an increase in a measurement wavelength in at least a part of a wavelength range in the visible region.

SUMMARY OF THE INVENTION

On the other hand, the reverse wavelength dispersibility of a thickness-direction phase difference, exhibited by optically anisotropic films in the related art, has not necessarily been sufficient, and accordingly, a further improvement has been required.

More specifically, as one of ideals of an optically anisotropic film having a thickness-direction phase difference, it is preferable that a ratio of a thickness-direction retardation in the visible region to a measurement wavelength is the same at each measurement wavelength. For example, it is desirable that a ratio 1 (thickness-direction retardation at a wavelength of 550 nm/550 nm) and a ratio 2 (thickness-direction retardation at a wavelength of 650 nm/650 nm) are the same. However, in optically anisotropic films in the related art, there is a tendency that a deviation from an ideal curve appears on a long wavelength side in the visible region. Furthermore, in the present specification, the optical characteristics which are closer to the ideal curve indicate that the reverse wavelength dispersibility is excellent.

Taking the circumstances into consideration, a first embodiment of the present invention has an object to provide an optically anisotropic film exhibiting reverse wavelength dispersibility with excellent thickness-direction phase differences.

Furthermore, a second embodiment of the present invention has an object to provide an optically anisotropic film exhibiting reverse wavelength dispersibility with excellent in-plane-direction phase differences.

In addition, the present invention has another object to provide a laminate, a circularly polarizing plate, and a display device.

The present inventors have conducted intensive studies on problems in the related art, and as a result, they have found that the objects can be accomplished by the following configurations.

(1) An optically anisotropic film satisfying Requirements 1 to 4 which will be described later.

(2) The optically anisotropic film as described in (1), in which the optically anisotropic film is formed of a composition including a liquid crystal compound or a polymer, and an infrared absorbing coloring agent.

(3) The optically anisotropic film as described in (2), in which the infrared absorbing coloring agent is a compound represented by Formula (1) which will be described later.

(4) The optically anisotropic film as described in any one of (1) to (3),
in which a liquid crystal compound is included, and
the liquid crystal compound is vertically aligned and thus fixed.

(5) A laminate comprising:
the optically anisotropic film as described in any one of (1) to (4); and
another optically anisotropic film different from the optically anisotropic film.

(6) The laminate as described in (5),
in which the other optically anisotropic film is a λ/4 plate.

(7) A circularly polarizing plate comprising:
the optically anisotropic film as described in any one of (1) to (4);
a λ/4 plate; and
a polarizer.

(8) A display device comprising:
a display element; and
the optically anisotropic film as described in any one of (1) to (4), arranged on the display element.

According to a first embodiment of the present invention, it is possible to provide an optically anisotropic film exhibiting reverse wavelength dispersibility with excellent thickness-direction phase differences.

Furthermore, according to a second embodiment of the present invention, it is possible to provide an optically anisotropic film exhibiting reverse wavelength dispersibility with excellent in-plane-direction phase differences.

In addition, according to the present invention, it is also possible to provide a laminate, a circularly polarizing plate, and a display device.

DESCRIPTION OF THE PREFERRED EMBODIMENTS

Figure 1:
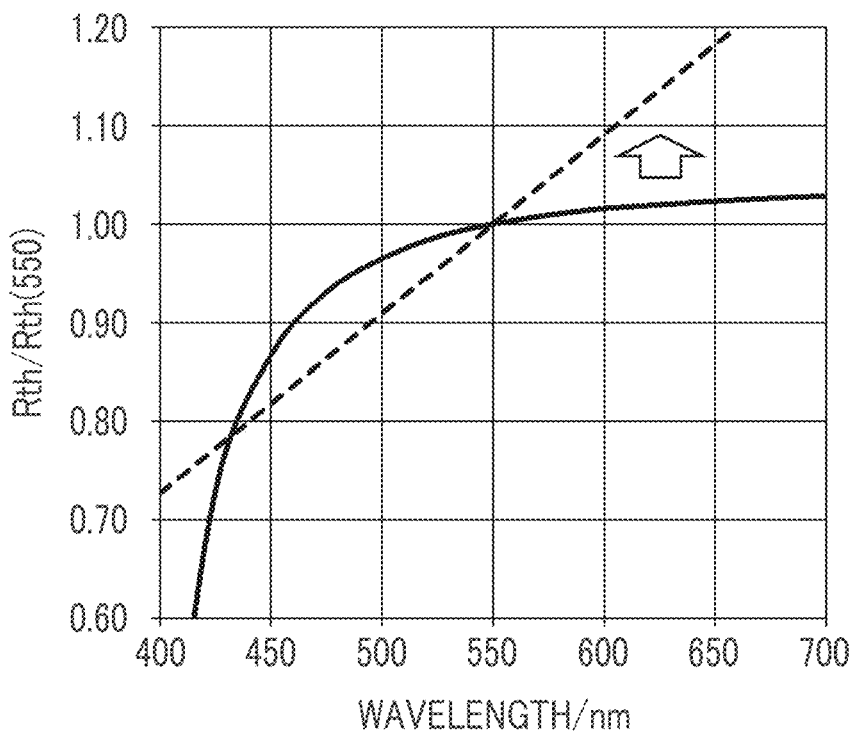
FIG. 1 is a view showing a comparison between the wavelength dispersion of an optically anisotropic film exhibiting reverse wavelength dispersibility in the related art and the wavelength dispersion of an ideal phase difference.

Hereinafter, the present invention will be described in detail. Furthermore, in the present specification, a numerical range expressed using "to" means a range that includes the preceding and succeeding numerical values of "to" as the lower limit value and the upper limit value, respectively. First, terms used in the present specification will be described.

In the present invention, $Re(\lambda)$ and $Rth(\lambda)$ represent an in-plane retardation and a thickness-direction retardation at a wavelength of $\lambda$, respectively. The wavelength of $\lambda$ refers to 550 nm unless otherwise specified.

In the present invention, $Re(\lambda)$ and $Rth(\lambda)$ are values measured at a wavelength of $\lambda$ in AxoScan OPMF-1 (manufactured by Opto Science, Inc.). By inputting an average refractive index $((nx+ny+nz)/3)$ and a film thickness (d (μm)) to AxoScan, the values can be calculated:

Slow axis direction(°)

$Re(\lambda)=R0(\lambda)$ $Rth(\lambda)=((nx+ny)/2-nz)\times d$.

Furthermore, $R0(\lambda)$ is expressed in a numerical value calculated with AxoScan OPMF-1, but means $Re(\lambda)$.

In the present specification, the refractive indices, nx, ny, and nz are measured with an Abbe refractometer (NAR-4T, manufactured by Atago Co., Ltd.), using a sodium lamp ($\lambda=589$ nm) as a light source. In addition, in a case where a wavelength dependency is measured, the wavelength dependency can be measured with a multi-wavelength Abbe refractometer DR-M2 (manufactured by Atago Co., Ltd.) in combination with an interference filter.

Moreover, the values mentioned in Polymer Handbook (JOHN WILEY & SONS, INC.) and the catalogues of various optical films can be used. The values of the average refractive indices of major optical films are exemplified below: cellulose acylate (1.48), cycloolefin polymer (1.52), polycarbonate (1.59), polymethyl methacrylate (1.49), and polystyrene (1.59).

Moreover, in the present specification, "visible rays" are intended to mean a light at a wavelength of 400 nm or more and less than 700 nm. Further, "infrared rays" are intended to mean light at a wavelength of 700 nm or more, "near-infrared rays" are intended to mean light at a wavelength from 700 nm to 2,000 nm, and "ultraviolet rays" are intended to mean light at a wavelength of 10 nm or more and less than 400 nm.

In addition, in the present specification, angles (for example, an angle of "90°") and a relationship thereof (for example, "perpendicular" and "parallel") include a range of errors tolerable in the technical field to which the present invention belongs. For example, the angle means an angle in a range of less than ±10° of a rigorous angle, and the error from the rigorous angle is preferably 5° or less, and more preferably 3° or less.

The bonding direction of a divalent group (for example, —O—CO—) as noted in the present specification is not particularly limited, and for example, in a case where $D^1$ in Formula (I) which will be described later is —O—CO—, and *1 and *2 represent a bonding position to the Ar side and a bonding position to the $G^1$ side, respectively, $D^1$ may be either *1—O—CO—*2 or *1—CO—O—*2.

FIG. 1 shows the wavelength dispersion characteristics of Rth at each wavelength in the visible region, normalized by setting a thickness-direction retardation Rth(550) at a measurement wavelength of 550 nm to 1. For example, in a case where the ratio of a thickness-direction retardation to a measurement wavelength is ¼ in the visible region, a birefringence is proportional to the measurement wavelength, as indicated by a dotted line in FIG. 1, and thus, the reverse wavelength dispersibility in which the measurement wavelength increases as a phase difference increases is exhibited. In contrast, with regard to an optically anisotropic film exhibiting reverse wavelength dispersibility in the related art, the wavelength dispersion characteristics are at positions overlapping an ideal curve indicated by a dotted line in the short wavelength range but show a tendency to deviate from the ideal curve in the long wavelength range, as indicated by a solid line in FIG. 1.

In the optically anisotropic film of an embodiment of the present invention, it is possible to approximate the optical characteristics in the long wavelength range to the ideal curve as indicated by an outlined arrow by controlling the optical characteristics.

A reason why the characteristics can be obtained will be described below.

First, the features of the optically anisotropic film of the embodiment of the present invention, satisfying Requirements 1 to 3 as mentioned later, will be described.

First, Requirement 1 will be described.

Figure 2:
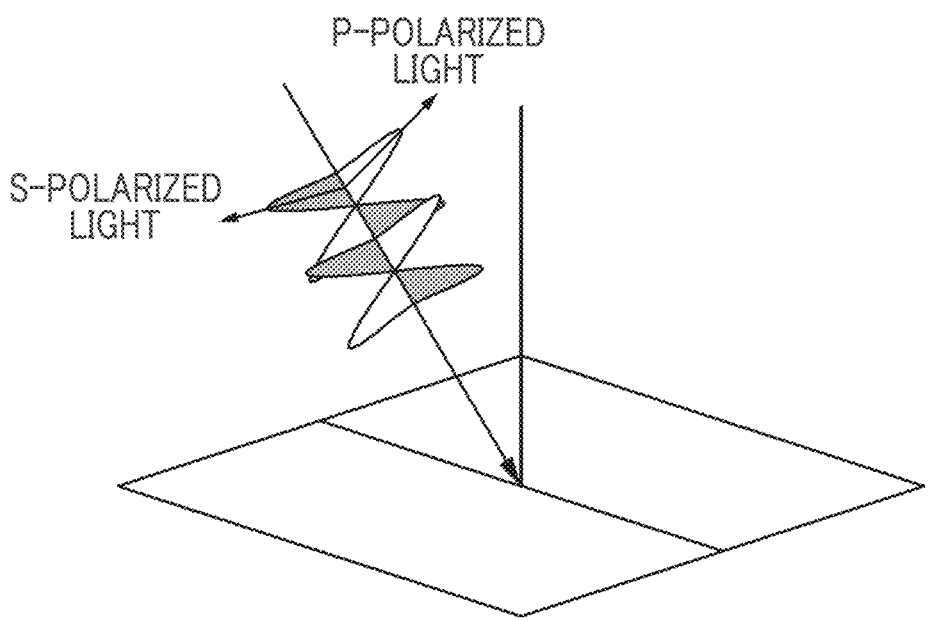
FIG. 2 is a view for explaining Requirement 1.
Figure 7:
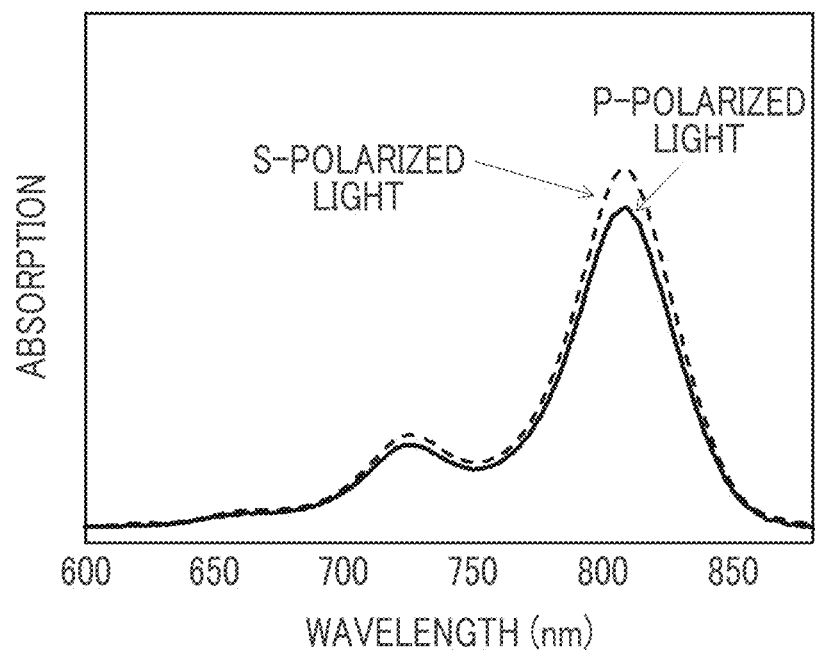
FIG. 7 is an absorption spectrum view in the infrared region at a polar angle of 45° in an optically anisotropic film of Example 1.

As shown in FIG. 2, in Requirement 1, P-polarized light and S-polarized light, which are linearly polarized light perpendicular to each other, are each irradiated from a direction inclined by 45° from a normal direction of a film surface of the optically anisotropic film. At that time, in the absorption intensity (absorbance) at a wavelength having the largest absorption in a wavelength range of 700 to 900 nm, an absorption intensity ratio in a case of irradiation with S-polarized light to the absorption intensity in a case of irradiation with P-polarized light (absorption intensity of S-polarized light/absorption intensity of P-polarized light) is determined, and the ratio is 1.02 or more (see FIG. 7 which will be described later with respect to a specific absorption spectrum view). A case where the ratio is 1.02 or more as described above means that there is absorption anisotropy in the thickness direction and the in-plane direction of the optically anisotropic film.

Furthermore, in the optically anisotropic film, Requirement 2 (Re(550)<10 nm) and Requirement 3 (Re(800)<10 nm) each mean that the refractive index anisotropy is small in the in-plane direction of the optically anisotropic film. In other words, it means that the anisotropy of absorption in the in-plane directions perpendicular to each other is small.

Figure 3:
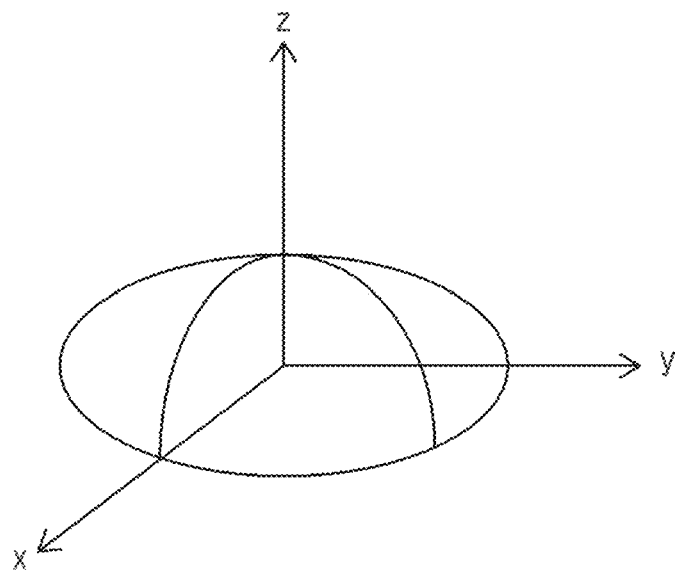
FIG. 3 is a view for showing the absorption characteristics of an optically anisotropic film.

The optically anisotropic film satisfying Requirements 1 to 3 has a larger absorption in the in-plane direction than the thickness-direction absorption in a wavelength range of 700 to 900 nm. More specifically, as shown in FIG. 3, the optically anisotropic film exhibits the same degree of absorption characteristics in the x-axis direction and the y-axis direction in the plane, and has a smaller absorption in the z-axis direction than the absorptions in the x-axis direction and the y-axis direction.

Figure 4:
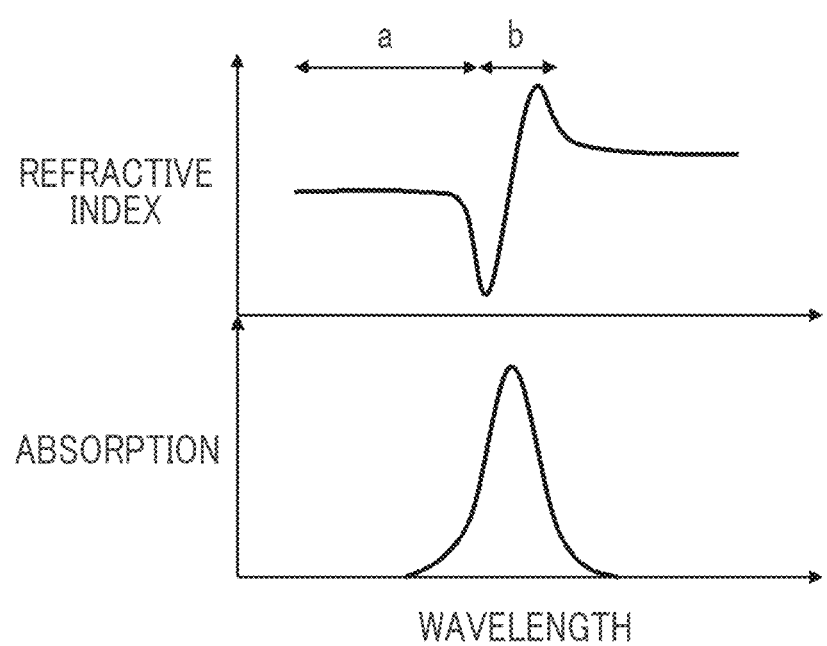
FIG. 4 is a view showing the wavelength dispersion characteristics with respect to a refractive index and an absorption coefficient of an organic molecule.

Next, the refractive index wavelength dispersion characteristics of ordinary organic molecules will be described with reference to FIG. 4. In FIG. 4, the upper side shows the behavior of a refractive index with respect to a wavelength, and the lower side shows the behavior (absorption spectrum) of absorption characteristics with respect to the wavelength.

For the organic molecule, a refractive index n in a region (a region a in FIG. 4) away from the intrinsic absorption wavelength decreases monotonically as the wavelength increases. Such the dispersion is referred to as "normal dispersion". In contrast, a refractive index n in a wavelength band including an intrinsic absorption (a region b in FIG. 4) rapidly increases as the wavelength increases. Such the dispersion is referred to as "anomalous dispersion".

That is, as shown in FIG. 4, an increase or decrease in the refractive index is observed immediately before the wavelength range with the absorption.

In the optically anisotropic film of the embodiment of the present invention, the absorption in the in-plane direction is larger than the thickness-direction absorption in a wavelength range of 700 to 900 nm due to the characteristics of the optically anisotropic film shown in Requirements 1 to 3. Hereinafter, such absorption characteristics are also referred to as absorption characteristics X. As described in detail later, the absorption characteristics X are accomplished by arranging the axial direction having a high absorbance of the infrared absorbing coloring agent in the optically anisotropic film to be in parallel with the in-plane direction.

In the optically anisotropic film exhibiting the absorption characteristics X, the thickness-direction retardation is large in the long wavelength range of the visible region due to the behavior described in FIG. 4 under an influence of the absorption characteristics X, and thus, the behavior indicated by an arrow in FIG. 1 is accomplished.

Hereinafter, the configuration of the optically anisotropic film of the embodiment of the present invention (hereinafter also referred to as an "optically anisotropic film X") (corresponding to the first embodiment of the present invention) satisfying Requirements 1 to 4 will be described in detail.

The optically anisotropic film X satisfies Requirement 1.

Requirement 1: In a case of irradiation with P-polarized light and S-polarized light, which are linearly polarized light perpendicular to each other, from a direction inclined by 45° from a normal direction of a film surface of the optically anisotropic film, an absorption intensity ratio in a case of irradiation with S-polarized light to an absorption intensity in a case of irradiation with P-polarized light is 1.02 or more in an absorption intensity at a wavelength having a largest absorption in a wavelength range of 700 to 900 nm.

The absorption intensity ratio only needs to be 1.02 or more, and from the viewpoint that the thickness-direction phase difference of the optically anisotropic film X exhibits a more excellent reverse wavelength dispersibility (hereinafter simply also referred to as an expression that "the effect of the present invention is more excellent"), the absorption intensity ratio is preferably 1.05 or more, and more preferably 1.08 or more. An upper limit thereof is not particularly limited, but is preferably 1.17 or less, and more preferably 1.15 or less.

Examples of the measurement method of Requirement 1 include a method of measuring an absorption in the infrared region at a polar angle of 45° using a spectrophotometer (MPC-3100 (manufactured by SHIMADZU Corporation)) equipped with a polarizer for infrared rays.

The optically anisotropic film X satisfies Requirement 2.
Requirement 2: Re(550)<10 nm
Re(550) represents an in-plane retardation of the optically anisotropic film at a wavelength of 550 nm.

Among those, Re(550) is preferably 5 nm or less. An upper limit thereof is not particularly limited, but may be 0 nm or more.

The optically anisotropic film X satisfies Requirement 3.
Requirement 3: Re(800)<10 nm
Re(800) represents an in-plane retardation of the optically anisotropic film at a wavelength of 800 nm.

Among those, Re(800) is preferably 5 nm or less. An upper limit thereof is not particularly limited, but may be 0 nm or more.

The optically anisotropic film X satisfies Requirement 4.
Requirement 4: Rth(450)/Rth(550)<1.00
Rth(450) represents a thickness-direction retardation of the optically anisotropic film at a wavelength of 450 nm, and Rth(550) represents a thickness-direction retardation of the optically anisotropic film at a wavelength of 550 nm.

Among those, Rth(450)/Rth(550) is preferably 0.97 or less, more preferably 0.92 or less, and still more preferably 0.87 or less. A lower limit thereof is not particularly limited, but is often 0.75 or more.

The optically anisotropic film X preferably satisfies Requirement 5.
Requirement 5: Rth(650)/Rth(550)>1.00
Rth(650) represents a thickness-direction retardation of the optically anisotropic film at a wavelength of 650 nm.

Among those, Rth(650)/Rth(550) is preferably 1.05 or more, more preferably 1.08 or more, and still more preferably 1.10 or more. An upper limit thereof is not particularly limited, but is preferably 1.25 or less, and more preferably 1.20 or less.

The thickness of the optically anisotropic film X is not particularly limited, but is preferably 10 μm or less, more preferably 0.5 to 8.0 μm, and still more preferably 0.5 to 6.0 μm from the viewpoint of reducing the thickness.

In addition, in the present specification, the thickness of the optically anisotropic film X is intended to mean an average thickness of the optically anisotropic film X. The average thickness is determined by measuring the thickness at any five or more points of the optically anisotropic film X and obtaining an arithmetic mean of the values.

Materials included in the optically anisotropic film X are not particularly limited as long as they satisfy Requirements 1 to 4.

The optically anisotropic film X preferably includes an infrared absorbing coloring agent. By allowing the optically anisotropic film X to include the infrared absorbing coloring agent, Requirement 1 is easily satisfied.

The optically anisotropic film X may include a matrix material for dispersing the infrared absorbing coloring agent, in addition to the infrared absorbing coloring agent.

Examples of the matrix material include a polymer compound obtained by polymerizing a polymerizable liquid crystal compound which will be described later, and a polymer which will be described later.

In addition, it is also preferable that the optically anisotropic film X includes a polymer (hereinafter also referred to as a "specific polymer") having a residue derived from an infrared absorbing coloring agent (hereinafter also simply referred to as an "infrared absorbing coloring agent residue"). In a case where the optically anisotropic film X includes the specific polymer, the optically anisotropic film X may include the matrix material.

Furthermore, the residue derived from the infrared absorbing coloring agent means a group obtained by removing any hydrogen atom from the infrared absorbing coloring agent, and for example, in a case where one hydrogen atom is removed, the residue is a monovalent infrared absorbing coloring agent residue is used, and in a case where two hydrogen atoms are removed, the residue is a divalent infrared absorbing coloring agent residue.

The molecular weight of the specific polymer is not particularly limited, but the weight-average molecular weight is preferably 5000 or more, and more preferably 10,000 or more. An upper limit thereof is not particularly limited, but is often 1,000,000 or less.

(Suitable Aspect 1)

One of suitable aspects of the optically anisotropic film X may be an optically anisotropic film X formed using a composition including a liquid crystal compound and an infrared absorbing coloring agent. In particular, an optically anisotropic film X, which is an optically anisotropic film obtained by vertically aligning and thus fixing a liquid crystal compound and includes an infrared absorbing coloring agent, is preferable.

Hereinafter, the components included in the composition will be described.

(Infrared Absorbing Coloring Agent)

The infrared absorbing coloring agent is a coloring agent having a maximum absorption wavelength in the infrared region.

The molecular weight of the infrared absorbing coloring agent is not particularly limited, but is preferably less than 5,000. A lower limit thereof is not particularly limited, but is often 500 or more.

Furthermore, in the present specification, the infrared absorbing coloring agent is a so-called low-molecular-weight compound, and the infrared absorbing coloring agent does not include a compound having a plurality of repeating units. That is, the specific polymer corresponds to a compound different from the infrared absorbing coloring agent (in other words, the specific polymer is not included in the infrared absorbing coloring agent).

Examples of the infrared absorbing coloring agent include diketopyrrolopyrrole-based coloring agents, diimmonium-based coloring agents, phthalocyanine-based coloring agents, naphthalocyanine-based coloring agents, azo-based coloring agents, polymethine-based coloring agents, anthraquinone-based coloring agents, pyrylium-based coloring agents, squarylium-based coloring agents, triphenylmethane-based coloring agents, cyanine-based coloring agents, and aminium-based coloring agents.

The infrared absorbing coloring agents may be used alone or in combination of two or more kinds thereof.

As the infrared absorbing coloring agent, a coloring agent having a maximum absorption wavelength in the near-infrared region (near-infrared absorbing coloring agent) is preferable.

From the viewpoint that the effect of the present invention is more excellent, the maximum absorption wavelength of the infrared absorbing coloring agent is preferably positioned in a wavelength range of 700 to 1,200 nm, and more preferably positioned in a wavelength range of 700 to 900 nm.

From the viewpoint that the effect of the present invention is more excellent, an integrated value of the absorbances in a wavelength range of 700 to 900 nm of the infrared absorbing coloring agent is preferably larger than an integrated value of the absorbances in a wavelength range of 400 to 700 nm of the infrared absorbing coloring agent.

The integrated value of the absorbances is a value obtained by summing the absorbances at the respective wavelengths ranging from X to Y nm.

The measurement can be carried out using a spectrophotometer (MPC-3100 manufactured by SHIMADZU Corporation).

Furthermore, the infrared absorbing coloring agent is preferably a dichroic coloring agent. Further, the dichroic coloring agent refers to a coloring agent having a property that an absorbance in the long axis direction and an absorbance in the short axis direction in the molecule are different from each other.

From the viewpoint that the effect of the present invention is more excellent, it is preferable that the infrared absorbing coloring agent has a mesogenic group. By incorporating the mesogenic group into the infrared absorbing coloring agent, the coloring agent can be easily aligned with a liquid crystal compound which will be described later and predetermined absorption characteristics can be easily controlled.

The mesogenic group is a functional group which is rigid and has alignment. Examples of the structure of the mesogenic group include a structure in which a plurality of groups selected from the group consisting of an aromatic ring group (an aromatic hydrocarbon ring group and an aromatic heterocyclic group) and an alicyclic group are linked directly or via a linking group (which represents, for example, —O—, —CO—, —C($R^0$)$_2$—, —CH=CH—, —CH=N—, —N=N—, —C≡C—, —$NR^0$—, or a combination thereof (for example, —COO—, —$CONR^0$—, —COOCH$_2$CH$_2$—, —CONRCH$_2$CH$_2$—, —OCOCH=CH—, and —C≡C—C≡C—), in which $R^0$ represents a hydrogen atom or an alkyl group having 1 to 6 carbon atoms).

Suitable aspects of the infrared absorbing coloring agent include a compound represented by Formula (1).

The compound represented by Formula (1) has a less absorption in the visible region, and an optically anisotropic film thus obtained is further suppressed from being colored. In addition, since the compound includes a group having a mesogenic group, it is easily aligned together with the liquid crystal compound. At this time, the group having a mesogenic group is arranged such that it extends horizontally from a fused ring moiety including a nitrogen atom at the center of the compound, and therefore, the fused ring moiety is easily aligned in a direction perpendicular to the alignment direction of the liquid crystal compound. Therefore, for example, in a case where the liquid crystal compound is aligned along the thickness direction of the optically anisotropic film X, an absorption in the near-infrared region (in particular, at a wavelength of 700 to 900 nm) derived from the fused ring moiety is easily obtained in a direction (in-plane direction) perpendicular to the thickness direction of the optically anisotropic film, and an optically anisotropic film exhibiting desired characteristics is easily obtained.

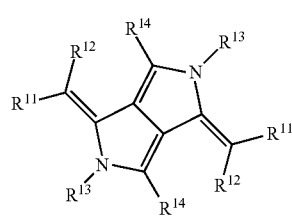

Formula (1)

$R^{11}$ and $R^{12}$ each independently represent a hydrogen atom or a substituent, at least one of $R^{11}$ or $R^{12}$ is an electron-withdrawing group, and $R^{11}$ and $R^{12}$ may be bonded to each other to form a ring.

Examples of the substituent include an alkyl group, an alkenyl group, an alkynyl group, an aryl group, an amino group, an alkoxy group, an aryloxy group, an aromatic heterocyclic oxy group, an acyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, an aromatic heterocyclic thio group, a sulfonyl group, a sulfinyl group, a ureide group, a phosphoric acid amide group, a hydroxy group, a mercapto group, a halogen atom, a cyano group, a sulfo group, a carboxyl group, a nitro group, a hydroxamic acid group, a sulfino group, a hydrazino group, an imino group, a heterocyclic group (for example, a heteroaryl group), a silyl group, and a group formed by combination of these groups. Further, the substituent may further be substituted with a substituent.

Furthermore, as the substituent represented by each of $R^{11}$ and $R^{12}$, a group other than the group having a mesogenic group which will be described later is preferable.

The electron-withdrawing group represents a substituent whose a Hammett's sigma para value (σp value) is positive, and examples thereof include a cyano group, an acyl group, an alkyloxycarbonyl group, an aryloxycarbonyl group, a sulfamoyl group, a sulfinyl group, and a heterocyclic group. These electron-withdrawing groups may further be substituted.

The Hammett's substituent constant σ value will be described. The Hammett rule is an empirical rule proposed by L. P. Hammett in 1935 in order to quantitatively discuss an influence of a substituent exerted on a reaction or equilibrium of a benzene derivative, and nowadays, its validity has been widely recognized. The substituent constants required for the Hammett rule include a σp value and a σm value, and these values are described in many general scientific articles. These are specifically described in, for example, "Lange's Handbook of Chemistry" edited by J. A. Dean, 12$^{th}$ edition, 1979 (McGraw-Hill), "Region of Chemistry", extra edition, No. 122, pp. 96 to 103, 1979 (Nankodo Co., Ltd.), Chem. Rev., 1991, Vol. 91, pp. 165 to 195, and the like. As the electron-withdrawing group in the embodiment of the present invention, a substituent having a Hammett's substituent constant σp value of 0.20 or more is preferable. The σp value is preferably 0.25 or more, more preferably 0.30 or more, and still more preferably 0.35 or more. An upper limit thereof is not particularly limited, but is preferably 0.80 or less.

Specific examples thereof include a cyano group (0.66), a carboxyl group (—COOH: 0.45), an alkoxycarbonyl group (—COOMe: 0.45), an aryloxycarbonyl group (—COOPh: 0.44), a carbamoyl group (—CONH$_2$: 0.36), an alkylcarbonyl group (—COMe: 0.50), an arylcarbonyl group (—COPh: 0.43), an alkylsulfonyl group (—SO$_2$Me: 0.72), and an arylsulfonyl group (—SO$_2$Ph: 0.68).

In the present specification, Me represents a methyl group and Ph represents a phenyl group. Further, the values in parentheses are σp values of the representative substituents as extracted from Chem. Rev., 1991, Vol. 91, pp. 165 to 195.

In a case where $R^{11}$ and $R^{12}$ are bonded to form a ring, $R^{11}$ and $R^{12}$ form a 5- to 7-membered ring (preferably a 5- or 6-membered ring), and it is typically preferable to use a ring thus formed as an acidic nucleus in a merocyanine coloring agent.

As the ring formed by the bonding of $R^{11}$ and $R^{12}$, a 1,3-dicarbonyl nucleus, a pyrazolinone nucleus, a 2,4,6-triketohexahydropyrimidine nucleus (including a thioketone form), a 2-thio-2,4-thiazolidinedione nucleus, a 2-thio-2,4-oxazolidinedione nucleus, a 2-thio-2,5-thiazolidinedione nucleus, a 2,4-thiazolidinedione nucleus, a 2,4-imidazolidinedione nucleus, a 2-thio-2,4-imidazolidinedione nucleus, a 2-imidazolin-5-one nucleus, a 3,5-pyrazolidinedione nucleus, a benzothiophen-3-one nucleus, or an indanone nucleus is preferable.

$R^{11}$ is preferably a heterocyclic group, and more preferably an aromatic heterocyclic group. The heterocyclic group may be either a monocycle or a polycycle. As the heterocyclic group, a pyrazole ring group, a thiazole ring group, an oxazole ring group, an imidazole ring group, an oxadiazole ring group, a thiadiazole ring group, a triazole ring group, a pyridine ring group, a pyridazine ring group, a pyrimidine ring group, a pyrazine ring group, such the benzo-fused ring group (for example, a benzothiazole ring group and a benzopyrazine ring group) or a naphtho-fused ring group, or a composite of these fused rings is preferable.

The heterocyclic group may be substituted with a substituent. Examples of the substituent include the examples of the substituent exemplified as the substituent represented by each of $R^{11}$ and $R^{12}$.

$R^{13}$'s each independently represent a hydrogen atom, an alkyl group, an aryl group, a heteroaryl group, a substituted boron (—B(Ra)$_2$, Ra represents a substituent), or a metal atom, or may be covalently bonded or coordinately bonded with $R^{11}$.

The substituent of the substituted boron represented by $R^{13}$ has the same definition as the above-mentioned substituent for each of $R^{11}$ and $R^{12}$, and is preferably an alkyl group, an aryl group, or a heteroaryl group. The substituent of the substituted boron (for example, the above-mentioned alkyl group, aryl group, or heteroaryl group) may further be substituted with a substituent. Examples of the substituent include the groups exemplified as the substituent represented by each of $R^{11}$ and $R^{12}$.

In addition, the metal atom represented by $R^{13}$ is preferably a transition metal atom, a magnesium atom, an aluminum atom, a calcium atom, a barium atom, a zinc atom, or a tin atom, and more preferably the aluminum atom, the zinc atom, the tin atom, the vanadium atom, the iron atom, the cobalt atom, the nickel atom, the copper atom, the palladium atom, the iridium atom, or the platinum atom.

$R^{14}$'s each independently represent a group having a mesogenic group. The definition of the mesogenic group is the same as mentioned above.

$R^{14}$ is preferably a group represented by Formula (2). * represents a bonding position.

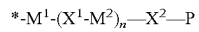

$$*\text{-}M^1\text{-}(X^1\text{-}M^2)_n\text{-}X^2\text{-}P \qquad \text{Formula (2)}$$

$M^1$ represents a substituted or unsubstituted arylene group, or a substituted or unsubstituted heteroarylene group. Examples of the arylene group include a phenylene group. Examples of the heteroarylene group include a divalent group obtained by removing any two hydrogen atoms from a pyrazole ring, a thiazole ring, an oxazole ring, an imidazole ring, an oxadiazole ring, a thiadiazole ring, a triazole ring, a pyridine ring, a pyridazine ring, a pyrimidine ring, a pyrazine ring, such the benzo-fused ring (for example, a benzothiazole ring and a benzopyrazine ring) or a naphtho-fused ring, or a composite of these fused rings. In a case where the arylene group and the heteroarylene group have a substituent, examples of the substituent include the groups exemplified as the substituent represented by each of $R^{11}$ and $R^{12}$.

$X^1$ represents a single bond, —O—, —CO—, —C($R^0$)$_2$—, —CH=CH—, —CH=N—, —N=N—, C≡C—, —$NR^0$—, or a combination thereof (for example, —COO—, —$CONR^0$—, —COOCH$_2$CH$_2$—, —CONRCH$_2$CH$_2$—, —OCOCH=CH—, and —C≡C—C≡C—). $R^0$ represents a hydrogen atom or an alkyl group having 1 to 5 carbon atoms.

$M^2$ represents a substituted or unsubstituted arylene group, a substituted or unsubstituted heteroarylene group, or a substituted or unsubstituted cycloalkylene group. Examples of the arylene group include a phenylene group. Examples of the heteroarylene group include a divalent group obtained by removing any two hydrogen atoms from a pyrazole ring, a thiazole ring, an oxazole ring, an imidazole ring, an oxadiazole ring, a thiadiazole ring, a triazole ring, a pyridine ring, a pyridazine ring, a pyrimidine ring, a pyrazine ring, such the benzo-fused ring (for example, a benzothiazole ring and a benzopyrazine ring) or a naphtho-fused ring, or a composite of these fused rings. The number of carbon atoms included in the cycloalkylene group is preferably 5 to 7. In a case where the arylene group, the heteroarylene group, and the cycloalkylene group have a substituent, examples of the substituent include the groups exemplified as the substituent represented by each of $R^{11}$ and $R^{12}$.

$X^2$ represents a single bond or a divalent linking group. Examples of the divalent linking group include a divalent hydrocarbon group (for example, a divalent aliphatic hydrocarbon group such as an alkylene group having 1 to 10 carbon atoms, an alkenylene group having 1 to 10 carbon atoms, and an alkynylene group having 1 to 10 carbon atoms, and a divalent aromatic hydrocarbon group such as an arylene group), a divalent heterocyclic group, —O—, —S—, —NH—, —N(Q)—, —CO—, or a group formed by combination of these groups (for example, —O-divalent hydrocarbon group-, —(O-divalent hydrocarbon group)$_m$—O— (m represents an integer of 1 or more), and -divalent hydrocarbon group-O—CO—). Q represents a hydrogen atom or an alkyl group.

n represents 1 to 10. Among these, n is preferably 1 to 5, and more preferably 2 to 4.

P represents a hydrogen atom or a polymerizable group. The definition of the polymerizable group is the same as that of the polymerizable group that may be contained in a liquid crystal compound which will be described later.

The infrared absorbing coloring agent is more preferably a compound represented by Formula (3).

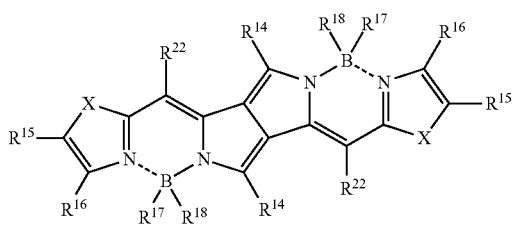

Formula (3)

The definition of $R^{14}$ is the same as mentioned above.

$R^{22}$'s each independently represent a cyano group, an acyl group, an alkoxycarbonyl group, an alkylsulfinyl group, an arylsulfinyl group, or a nitrogen-containing heteroaryl group.

$R^{15}$ and $R^{16}$ each independently represent a hydrogen atom, an alkyl group, an alkoxy group, an aryl group, or a heteroaryl group, and $R^{15}$ and $R^{16}$ may be bonded to each other to form a ring. Examples of the ring thus formed include an alicycle having 5 to 10 carbon atoms, an aromatic hydrocarbon ring having 6 to 10 carbon atoms, and an aromatic heterocyclic ring having 3 to 10 carbon atoms. The ring formed by the bonding of $R^{15}$ and R16 may further be substituted with a substituent. Examples of the substituent include the groups exemplified in the description of the substituent represented by each of $R^{11}$ and $R^{12}$.

$R^{17}$ and $R^{18}$ each independently represent an alkyl group, an alkoxy group, an aryl group, or a heteroaryl group. The group represented by each of $R^{17}$ and $R^{18}$ may further be substituted with a substituent. Examples of the substituent include the groups exemplified in the description of the substituent represented by each of $R^{11}$ and $R^{12}$.

X's each independently represent an oxygen atom, a sulfur atom, —NR—, —CRR'—, —CH=CH—, or —N=CH—, and R and R' each independently represent a hydrogen atom, an alkyl group, or an aryl group.

The content of the infrared absorbing coloring agent in the composition is not particularly limited, but from the viewpoint that the effect of the present invention is more excellent, the content is preferably 5% to 70% by mass, and more preferably 10% to 50% by mass with respect to the total mass of the liquid crystal compound.

<Liquid Crystal Compound>

The type of the liquid crystal compound is not particularly limited, but the liquid crystal compounds can be classified into a rod-shaped type (rod-shaped liquid crystal compound) and a disk-shaped type (disk-shaped liquid crystal compound, a discotic liquid crystal compound) based on the shape. Each of the types can further be classified into a low-molecular type and a high-molecular type. The expression, being high-molecular, generally refers to having a degree of polymerization of 100 or more (Polymer Physics•Phase Transition Dynamics, by Masao Doi, page 2, published by Iwanami Shoten, Publishers, 1992). In addition, two or more kinds of the rod-shaped liquid crystal compounds, two or more kinds of the disk-shaped liquid crystal compounds, or a mixture of the rod-shaped liquid crystal compound and the disk-shaped liquid crystal compound may be used.

The position of the maximum absorption wavelength of the liquid crystal compound is not particularly limited, but from the viewpoint that the effect of the present invention is more excellent, it is preferable that the maximum absorption wavelength is positioned in the ultraviolet region.

The liquid crystal compound is preferably a reverse wavelength dispersible liquid crystal compound. The reverse wavelength dispersible liquid crystal compound means a compound in which an optically anisotropic film formed using the compound exhibits reverse wavelength dispersibility. That is, the reverse wavelength dispersible liquid crystal compound means a compound in which the in-plane retardation of an optically anisotropic film formed using the compound increases as the measurement wavelength increases and approaches an ideal curve.

From the viewpoint that changes in the temperature and the humidity of the optical characteristics can be suppressed, a liquid crystal compound (hereinafter also referred to as a "polymerizable liquid crystal compound") having a polymerizable group is preferable as the liquid crystal compound. The liquid crystal compounds may be a mixture of two or more kinds thereof, and in this case, it is preferable that at least one has two or more polymerizable groups.

That is, it is preferable that the optically anisotropic film is a layer formed by the fixation of a composition including a polymerizable liquid crystal compound by polymerization or the like, and in this case, it is not necessary to exhibit the liquid crystallinity any longer after forming the layer.

The type of the polymerizable group is not particularly limited, and a polymerizable group which is radically polymerizable or cationically polymerizable is preferable.

A known radically polymerizable group can be used as the radically polymerizable group, and an acryloyl group or a methacryloyl group is preferable.

A known cationically polymerizable group can be used as the cationically polymerizable group, and specific examples thereof include an alicyclic ether group, a cyclic acetal group, a cyclic lactone group, a cyclic thioether group, a spiroorthoester group, and a vinyloxy group. Among those, the alicyclic ether group or the vinyloxy group is preferable, and the epoxy group, the oxetanyl group, or the vinyloxy group is more preferable.

In particular, preferred examples of the polymerizable group include the following groups.

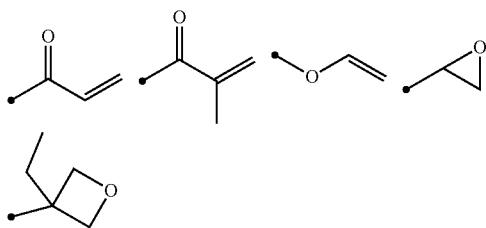

Among those, a compound represented by Formula (I) is preferable as the liquid crystal compound.

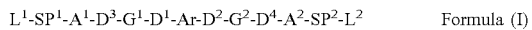

In Formula (I), $D^1$, $D^2$, $D^3$, and $D^4$ each independently represent a single bond, —O—Co—, —C(=S)O—, —CR$^1$R$^2$—, —CR$^1$R$^2$—CR$^3$R$^4$—, —O—CR$^1$R$^2$—, —CR$^1$R$^2$—O—CR$^3$R$^4$—, —CO—O—CR$^1$R$^2$—, —O—CO—CR$^1$R$^2$—, —CR$^1$R$^2$—O—CO—CR$^3$R$^4$—, —CR$^1$R$^2$—CO—O—CR$^3$R$^4$—, —NR$^1$—CR$^2$R$^3$—, or —CO—NR$^1$—.

$R^1$, $R^2$, $R^3$, and $R^4$ each independently represent a hydrogen atom, a fluorine atom, or an alkyl group having 1 to 4 carbon atoms.

Moreover, in Formula (I), $G^1$ and $G^2$ each independently represent a divalent alicyclic hydrocarbon group having 5 to 8 carbon atoms, and one or more of —CH$_2$—'s constituting the alicyclic hydrocarbon group may be substituted with —O—, —S—, or —NH—.

Furthermore, in Formula (I), $A^1$ and $A^2$ each independently represent a single bond, an aromatic ring having 6 or more carbon atoms, or a cycloalkylene ring having 6 or more carbon atoms.

Moreover, in Formula (I), $SP^1$ and $SP^2$ each independently represent a single bond, a linear or branched alkylene group having 1 to 14 carbon atoms, or a divalent linking group in which one or more of —CH$_2$—'s constituting the linear or branched alkylene group having 1 to 14 carbon atoms are substituted with —O—, —S—, —NH—, —N(Q)-, or —CO—, and Q represents a polymerizable group.

Incidentally, in Formula (I), $L^1$ and $L^2$ each independently represent a monovalent organic group (for example, an alkyl group or a polymerizable group).

In addition, in a case where Ar is a group represented by Formula (Ar-1), Formula (Ar-2), Formula (Ar-4), or Formula (Ar-5) which will be described later, at least one of $L^1$ or $L^2$ represents a polymerizable group. In addition, in a case where Ar is a group represented by Formula (Ar-3) which will be described later, at least one of $L^1$ or $L^2$, or $L^3$ or $L^4$ in Formula (Ar-3) represents a polymerizable group.

In Formula (I), a 5- or 6-membered ring is preferable as the divalent alicyclic hydrocarbon group having 5 to 8 carbon atoms represented by each of $G^1$ and $G^2$. Further, the alicyclic hydrocarbon group may be either a saturated alicyclic hydrocarbon group or an unsaturated alicyclic hydrocarbon group, but is preferably the saturated alicyclic hydrocarbon group. With respect to the divalent alicyclic hydrocarbon group represented by each of $G^1$ and $G^2$, reference can be made to, for example, the description in paragraph 0078 of JP2012-21068A, the contents of which are incorporated herein by reference.

In Formula (I), examples of the aromatic ring having 6 or more carbon atoms represented by each of $A^1$ and $A^2$ include aromatic hydrocarbon rings such as a benzene ring, a naphthalene ring, an anthracene ring, and a phenanthroline ring; and aromatic heterocyclic rings such as a furan ring, a pyrrole ring, a thiophene ring, a pyridine ring, a thiazole ring, and a benzothiazole ring. Among those, the benzene ring (for example, a 1,4-phenyl group) is preferable.

Furthermore, in Formula (I), examples of the cycloalkylene ring having 6 or more carbon atoms represented by each of $A^1$ and $A^2$ include a cyclohexane ring and a cyclohexene ring, and among these, the cyclohexane ring (for example, a cyclohexane-1,4-diyl group) is preferable.

In Formula (I), as the linear or branched alkylene group having 1 to 14 carbon atoms represented by each of $SP^1$ and $SP^2$, a methylene group, an ethylene group, a propylene group, or a butylene group is preferable.

In Formula (I), the polymerizable group represented by each of $L^1$ and $L^2$ is not particularly limited, but a radically polymerizable group (a group which is radically polymerizable) or a cationically polymerizable group (a group which is cationically polymerizable) is preferable.

A suitable range of the radically polymerizable group is as described above.

On the other hand, in Formula (I), Ar represents any aromatic ring selected from the group consisting of groups represented by Formulae (Ar-1) to (Ar-7). In addition, in Formulae (Ar-1) to (Ar-7), *1 represents a bonding position with $D^1$ and *2 represents a bonding position with $D^2$.

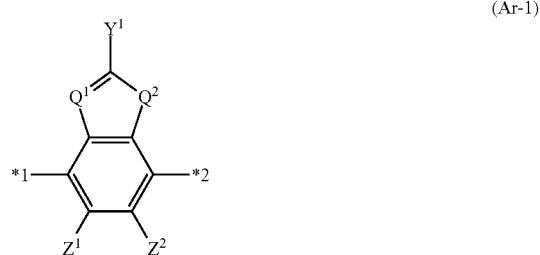

(Ar-1)

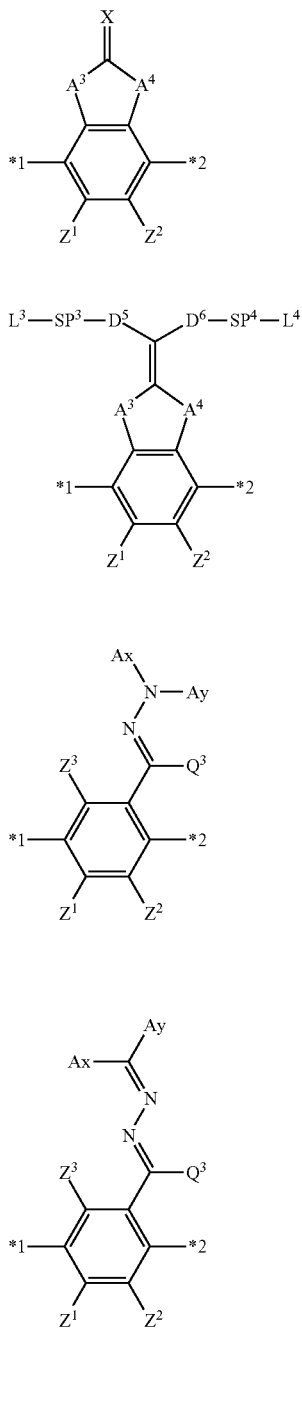

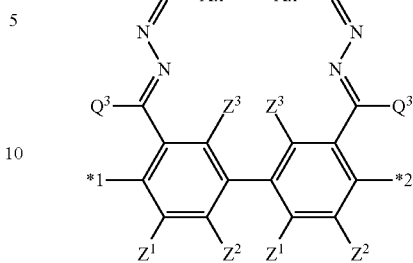

Here, in Formula (Ar-1), $Q^1$ represents N or CH, $Q^2$ represents —S—, —O—, or —N($R^5$)—, $R^5$ represents a hydrogen atom or an alkyl group having 1 to 6 carbon atoms, and $Y^1$ represents an aromatic hydrocarbon ring group having 6 to 12 carbon atoms or an aromatic heterocyclic group having 3 to 12 carbon atoms, each of which may have a substituent.

Examples of the alkyl group having 1 to 6 carbon atoms represented by $R^5$ include a methyl group, an ethyl group, a propyl group, an isopropyl group, an n-butyl group, an isobutyl group, a sec-butyl group, a tert-butyl group, an n-pentyl group, and an n-hexyl group.

Examples of the aromatic hydrocarbon ring group having 6 to 12 carbon atoms represented by $Y^1$ include aryl groups such as a phenyl group, a 2,6-diethylphenyl group, and a naphthyl group.

Examples of the aromatic heterocyclic group having 3 to 12 carbon atoms represented by $Y^1$ include heteroaryl groups such as a thienyl group, a thiazolyl group, a furyl group, a pyridyl group, and a benzofuryl group. Further, examples of the aromatic heterocyclic group further include a group formed by fusion of a benzene ring and an aromatic heterocyclic ring.

In addition, examples of the substituent which may be contained in $Y^1$ include an alkyl group, an alkoxy group, a nitro group, an alkylsulfonyl group, an alkyloxycarbonyl group, a cyano group, and a halogen atom.

As the alkyl group, for example, a linear, branched, or cyclic alkyl group having 1 to 18 carbon atoms is preferable, an alkyl group having 1 to 8 carbon atoms (for example, a methyl group, an ethyl group, a propyl group, an isopropyl group, an n-butyl group, an isobutyl group, a sec-butyl group, a t-butyl group, and a cyclohexyl group) is more preferable, an alkyl group having 1 to 4 carbon atoms is still more preferable, and the methyl group or the ethyl group is particularly preferable.

As the alkoxy group, for example, an alkoxy group having 1 to 18 carbon atoms is preferable, an alkoxy group having 1 to 8 carbon atoms (for example, a methoxy group, an ethoxy group, an n-butoxy group, and a methoxyethoxy group) is more preferable, an alkoxy group having 1 to 4 carbon atoms is still more preferable, and the methoxy group or the ethoxy group is particularly preferable.

Examples of the halogen atom include a fluorine atom, a chlorine atom, a bromine atom, and an iodine atom, and the fluorine atom or the chlorine atom is preferable.

In addition, in Formulae (Ar-1) to (Ar-7), $Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon ring group having 6 to 20 carbon atoms, a halogen atom, a cyano group, a nitro group, —NR$^6$R$^7$, or —SR$^8$, R$^6$ to R$^8$ each independently represent a hydrogen atom or an alkyl group having 1 to 6 carbon atoms, and Z$^1$ and Z$^2$ may be bonded to each other to form a ring. The ring may be any of an alicyclic ring, a heterocyclic ring, and an aromatic ring, and is preferably the aromatic ring. In addition, a ring thus formed may be substituted with a substituent.

As the monovalent aliphatic hydrocarbon group having 1 to 20 carbon atoms, an alkyl group having 1 to 15 carbon atoms is preferable, an alkyl group having 1 to 8 carbon atoms is more preferable, a methyl group, an ethyl group, an isopropyl group, a tert-pentyl group (1,1-dimethylpropyl group), a tert-butyl group, or a 1,1-dimethyl-3,3-dimethylbutyl group is still more preferable, and the methyl group, the ethyl group, or the tert-butyl group is particularly preferable.

Examples of the monovalent alicyclic hydrocarbon group having 3 to 20 carbon atoms include a monocyclic saturated hydrocarbon group such as a cyclopropyl group, a cyclobutyl group, a cyclopentyl group, a cyclohexyl group, a cycloheptyl group, a cyclooctyl group, a cyclodecyl group, a methylcyclohexyl group, and ethylcyclohexyl group; a monocyclic unsaturated hydrocarbon group such as a cyclobutenyl group, a cyclopentenyl group, a cyclohexenyl group, a cycloheptenyl group, a cyclooctenyl group, a cyclodecenyl group, a cyclopentadienyl group, a cyclohexadienyl group, a cyclooctadienyl group, and a cyclodecadiene group; and a polycyclic saturated hydrocarbon group such as a bicyclo[2.2.1]heptyl group, a bicyclo[2.2.2]octyl group, a tricyclo[5.2.1.0$^{2,6}$]decyl group, a tricyclo[3.3.1.1$^{3,7}$]decyl group, a tetracyclo[6.2.1.1$^{3,6}$.0$^{2,7}$]dodecyl group, and an adamantyl group.

Examples of the monovalent aromatic hydrocarbon ring group having 6 to 20 carbon atoms include a phenyl group, a 2,6-diethylphenyl group, a naphthyl group, and a biphenyl group, and an aryl group having 6 to 12 carbon atoms (particularly a phenyl group) is preferable.

Examples of the halogen atom include a fluorine atom, a chlorine atom, a bromine atom, and an iodine atom, and the fluorine atom, the chlorine atom, or the bromine atom is preferable.

On the other hand, examples of the alkyl group having 1 to 6 carbon atoms represented by each of R$^6$ to R$^8$ include a methyl group, an ethyl group, a propyl group, an isopropyl group, an n-butyl group, an isobutyl group, a sec-butyl group, a tert-butyl group, an n-pentyl group, and an n-hexyl group.

In addition, in Formulae (Ar-2) and (Ar-3), A$^3$ and A$^4$ each independently represent a group selected from the group consisting of —O—, —N(R$^9$)—, —S—, and —CO—, and R$^9$ represents a hydrogen atom or a substituent.

Examples of the substituent represented by R$^9$ include the same ones as the substituents which may be contained in Y$^1$ in Formula (Ar-1).

Furthermore, in Formula (Ar-2), X represents a hydrogen atom or a non-metal atom of Groups 14 to 16 to which a substituent may be bonded.

Moreover, examples of the non-metal atom of Groups 14 to 16 represented by X include an oxygen atom, a sulfur atom, a nitrogen atom having a substituent, and a carbon atom having a substituent, and examples of the substituent include the same ones as the substituents which may be contained in Y$^1$ in Formula (Ar-1).

In addition, in Formula (Ar-3), D$^5$ and D$^6$ each independently represent a single bond, —O—CO—, —C(=S)O—, —CR$^1$R$^2$—, —CR$^1$R$^2$—CR$^3$R$^4$—, —O—CR$^1$R$^2$—, —CR$^1$R$^2$—O—CR$^3$R$^4$—, —CO—O—CR$^1$R$^2$—, —O—CO—CR$^1$R$^2$—, —CR$^1$R$^2$—O—CO—CR$^3$R$^4$—, —CR$^1$R$^2$—CO—O—CR$^3$R$^4$—, —NR$^1$—CR$^2$R$^3$—, or —CO—NR$^1$—. R$^1$, R$^2$, R$^3$, and R$^4$ each independently represent a hydrogen atom, a fluorine atom, or an alkyl group having 1 to 4 carbon atoms.

Moreover, in Formula (Ar-3), SP$^3$ and SP$^4$ each independently represent a single bond, a linear or branched alkylene group having 1 to 12 carbon atoms, or a divalent linking group in which one or more of —CH$_2$—'s constituting the linear or branched alkylene group having 1 to 12 carbon atoms are substituted with —O—, —S—, —NH—, —N(Q)-, or —CO—, and Q represents a polymerizable group.

Furthermore, in Formula (Ar-3), L$^3$ and L$^4$ each independently represent a monovalent organic group (for example, an alkyl group and a polymerizable group), and at least one of L$^3$ or L$^4$, or L$^1$ or L$^2$ in Formula (I) represents a polymerizable group.

Moreover, in Formulae (Ar-4) and (Ar-7), Ax represents an organic group having 2 to 30 carbon atoms, which has at least one aromatic ring selected from the group consisting of an aromatic hydrocarbon ring and an aromatic heterocyclic ring.

Furthermore, in Formulae (Ar-4) to (Ar-7), Ay represents a hydrogen atom, an alkyl group having 1 to 6 carbon atoms, which may have a substituent, or an organic group having 2 to 30 carbon atoms, which has at least one aromatic ring selected from the group consisting of an aromatic hydrocarbon ring and an aromatic heterocyclic ring.

Here, the aromatic ring in each of Ax and Ay may have a substituent, and Ax and Ay may be bonded to each other to form a ring.

In addition, Q$^3$ represents a hydrogen atom or an alkyl group having 1 to 6 carbon atoms, which may have a substituent.

Examples of Ax and Ay include those described in paragraphs 0039 to 0095 of WO2014/010325A.

Incidentally, examples of the alkyl group having 1 to 6 carbon atoms represented by Q$^3$ include a methyl group, an ethyl group, a propyl group, an isopropyl group, an n-butyl group, an isobutyl group, a sec-butyl group, a tert-butyl group, an n-pentyl group, and an n-hexyl group, and examples of the substituent include the same ones as the substituents which may be contained in Y$^1$ in Formula (Ar-1).

Among those, from the viewpoint that the effect of the present invention is more excellent, it is preferable that at least one of A$^1$ or A$^2$ is a cycloalkylene ring having 6 or more carbon atoms, and it is more preferable that one of A$^1$ and A$^2$ is a cycloalkylene ring having 6 or more carbon atoms.

The content of the liquid crystal compound in the composition is not particularly limited, but is preferably 50% by mass or more, and more preferably 70% by mass or more with respect to the total solid content in the composition. An upper limit thereof is not particularly limited, but is often 90% by mass or less.

In addition, the total solid content in the composition does not include a solvent. That is, the solid content means a component obtained by removing the solvent from the composition.

Furthermore, the composition may further include a forward wavelength dispersible liquid crystal compound. The forward wavelength dispersible liquid crystal compound means a compound in which an optically anisotropic film formed using the compound exhibits forward wavelength dispersibility. That is, the forward wavelength dispersible liquid crystal compound means a compound in which the in-plane retardation of an optically anisotropic film formed using the compound decreases as the measurement wavelength increases.

Addition of a forward wavelength dispersible liquid crystal compound makes it possible to adjust the wavelength dispersion of a composition and impart wavelength dispersibility closer to ideal wavelength dispersion.

The composition may include components other than the above-mentioned infrared absorbing coloring agent and liquid crystal compound.

The composition may include a polymerization initiator. The polymerization initiator to be used is selected according to the type of a polymerization reaction, and examples thereof include a thermal polymerization initiator and a photopolymerization initiator. Examples of the photopolymerization initiator include an α-carbonyl compound, an acyloin ether, an α-hydrocarbon substituted aromatic acyloin compound, a polynuclear quinone compound, and a combination of a triarylimidazole dimer and a p-aminophenyl ketone.

The content of the polymerization initiator in the composition is preferably 0.01% to 20% by mass, and more preferably 0.5% to 10% by mass with respect to the total solid content of the composition.

In addition, the composition may include a polymerizable monomer.

Examples of the polymerizable monomer include a radically polymerizable or cationically polymerizable compound. Among those, a polyfunctional radically polymerizable monomer is preferable. In addition, as the polymerizable monomer, a monomer which is copolymerizable with the liquid crystal compound having a polymerizable group is preferable. Examples of the polymerizable monomer include those described in paragraphs 0018 to 0020 of JP2002-296423A.

The content of the polymerizable monomer in the composition is preferably 1% to 50% by mass, and more preferably 2% to 30% by mass with respect to the total mass of the liquid crystal compound.

Moreover, the composition may include a surfactant. Examples of the surfactant include compounds known in the related art, but a fluorine-based compound is preferable. Examples of the compound include the compounds described in paragraphs 0028 to 0056 of JP2001-330725A and the compounds described in paragraphs 0069 to 0126 of JP2003-295212A.

Furthermore, the composition may include a solvent. As the solvent, an organic solvent is preferable. Examples of the organic solvent include an amide (for example, N,N-dimethylformamide), a sulfoxide (for example, dimethyl sulfoxide), a heterocyclic compound (for example, pyridine), a hydrocarbon (for example, benzene and hexane), an alkyl halide (for example, chloroform and dichloromethane), an ester (for example, methyl acetate, ethyl acetate, and butyl acetate), a ketone (for example, acetone and methyl ethyl ketone), and an ether (for example, tetrahydrofuran and 1,2-dimethoxyethane). In addition, two or more kinds of the organic solvents may be used in combination.

Moreover, the composition may include various alignment control agents such as a vertical alignment agent and a horizontal alignment agent. The vertical alignment agent is a compound capable of vertically controlling the alignment of a liquid crystal compound at an interface. The horizontal alignment agent is a compound capable of horizontally controlling the alignment of a liquid crystal compound at an interface.

Examples of the vertical alignment agent include a boronic acid compound and an onium salt.

A compound represented by Formula (20) is preferable as the boronic acid compound.

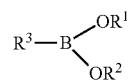

Formula (20)

In Formula (20), $R^1$ and $R^2$ each independently represent a hydrogen atom, a substituted or unsubstituted aliphatic hydrocarbon group, a substituted or unsubstituted aryl group, or a substituted or unsubstituted heterocyclic group.

$R^3$ represents a substituent including a (meth)acrylic group.

Specific examples of the boronic acid compound include the boronic acid compound represented by General Formula (I) described in paragraphs 0023 to 0032 of JP2008-225281A.

As the onium salt, a compound represented by Formula (21) is preferable.

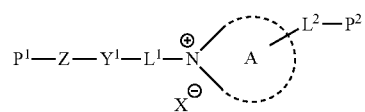

Formula (21)

In Formula (21), the ring A represents a quaternary ammonium ion consisting of a nitrogen-containing heterocycle. X represents an anion. $L^1$ represents a divalent linking group. $L^2$ represents a single bond or a divalent linking group. $Y^1$ represents a divalent linking group having a 5- or 6-membered ring as a partial structure. Z represents a divalent linking group having 2 to 20 alkylene groups as a partial structure. $P^1$ and $P^2$ each independently represent a monovalent substituent having a polymerizable and ethylenically unsaturated bond.

Specific examples of the onium salt include the onium salts described in paragraphs 0052 to 0058 of JP2012-208397A, the onium salts described in paragraphs 0024 to 0055 of JP2008-026730A, and the onium salts described in JP2002-37777A.

The content of the vertical alignment agent in the composition is preferably 0.1% to 400% by mass, and more preferably 0.5% to 350% by mass with respect to the total mass of the liquid crystal compound.

The vertical alignment agents may be used alone or in combination of two or more kinds thereof. In a case where two or more kinds of vertical alignment agents are used, a total amount thereof is preferably in the range.

The composition preferably includes a leveling agent.

The leveling agent is not particularly limited, and is preferably a leveling agent including a fluorine atom (fluorine-based leveling agent) or a leveling agent including a silicon atom (silicon-based leveling agent), and more preferably the fluorine-based leveling agent.

Examples of the fluorine-based leveling agent include fatty acid esters of polyvalent carboxylic acids, in which a part of a fatty acid is substituted with a fluoroalkyl group, and polyacrylates having a fluoro substituent. In particular, a leveling agent including a repeating unit derived from the compound represented by Formula (22) is preferable.

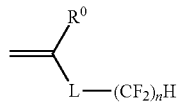

Formula (22)

R⁰ represents a hydrogen atom, a halogen atom, or a methyl group.

L represents a divalent linking group. As L, an alkylene group having 2 to 16 carbon atoms is preferable, and any —CH$_2$— which is not adjacent to the alkylene group may be substituted with —O—, —COO—, —CO—, or —CONH—.

n represents an integer of 1 to 18.

The leveling agent having a repeating unit derived from the compound represented by Formula (22) may further include another repeating unit.

Examples of the other repeating unit include a repeating unit derived from a compound represented by Formula (23).

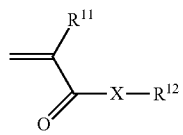

Formula (23)

R$^{11}$ represents a hydrogen atom, a halogen atom, or a methyl group.

X represents an oxygen atom, a sulfur atom, or —N(R$^{13}$)—. R$^{13}$ represents a hydrogen atom or an alkyl group having 1 to 8 carbon atoms.

R$^{12}$ represents a hydrogen atom, an alkyl group which may have a substituent, or an aromatic group which may have a substituent. The alkyl group preferably has 1 to 20 carbon atoms. The alkyl group may be any of linear, branched, and cyclic forms.

In addition, examples of the substituent which may be contained in the alkyl group include a poly(alkyleneoxy) group and a polymerizable group. The definition of the polymerizable group is the same as mentioned above.

In a case where the leveling agent includes a repeating unit derived from the compound represented by Formula (22) and the repeating unit derived from the compound represented by Formula (23), the content of the repeating unit derived from the compound represented by Formula (22) is preferably 10% to 90% by mole, and more preferably 15% to 95% by mole with respect to all the repeating units included in the leveling agent.

In a case where the leveling agent includes the repeating unit derived from the compound represented by Formula (22) and the repeating unit derived from the compound represented by Formula (23), the content of the repeating unit derived from the compound represented by Formula (23) is preferably 10% to 90% by mole, and more preferably 5% to 85% by mole with respect to all the repeating units included in the leveling agent.

In addition, examples of the leveling agent also include a leveling agent including a repeating unit derived from the compound represented by Formula (24) instead of the repeating unit derived from the compound represented by Formula (22).

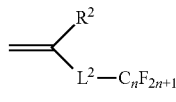

Formula (24)

R$^2$ represents a hydrogen atom, a halogen atom, or a methyl group.

L$^2$ represents a divalent linking group.

n represents an integer of 1 to 18.

Specific examples of the leveling agent include the compounds exemplified in paragraphs 0046 to 0052 of JP2004-331812A and the compounds described in paragraphs 0038 to 0052 of JP2008-257205A.

The content of the leveling agent in the composition is preferably 10% to 80% by mass, and more preferably 20% to 60% by mass with respect to the total mass of the liquid crystal compound.

The leveling agents may be used alone or in combination of two or more kinds thereof. In a case where two or more kinds of leveling agents are used, a total amount thereof is preferably in the range.

In addition, the composition may include an adhesion improver and a plasticizer, in addition to the components.

A method for producing the optically anisotropic film X using the composition is not particularly limited, and examples thereof include known methods.

Among those, from the viewpoint that the retardation is easily controlled, a method in which a composition including a polymerizable liquid crystal compound and an infrared absorbing coloring agent is applied to form a coating film, the coating film is subjected to an alignment treatment to vertically align the polymerizable liquid crystal compound, and the obtained coating film is subjected to a curing treatment (irradiation with ultraviolet rays (light irradiation treatment) or a heating treatment) to form an optically anisotropic film X is preferable.

That is, the optically anisotropic film X is preferably a film formed by fixing a liquid crystal compound (in particular, a polymerizable liquid crystal compound) which has been vertically aligned.

Hereinafter, the procedure of the method will be described in detail.

First, the composition is applied onto a support to form a coating film and the coating film is subjected to an alignment treatment to align the polymerizable liquid crystal compound.

The composition to be used includes a polymerizable liquid crystal compound. The definition of the polymerizable liquid crystal compound is the same as mentioned above.

The support to be used is a member having a function as a base material for applying a composition thereon. The support may be a temporary support which is peeled after applying the composition and performing curing.

As the support (temporary support), a glass substrate may be used, in addition to a plastic film. Examples of a material constituting the plastic film include a polyester resin such as polyethylene terephthalate, a polycarbonate resin, a (meth) acryl resin, an epoxy resin, a polyurethane resin, a polyamide resin, a polyolefin resin, a cellulose derivative, a silicone resin, and polyvinyl alcohol.

The thickness of the support only needs to be about 5 to 1,000 µm, and is preferably 10 to 250 µm, and more preferably 15 to 90 µm.

Moreover, an alignment layer may be arranged on the support, as desired.

The alignment layer generally includes a polymer as a main component. Polymer materials for an alignment layer are described in many documents and a large number of commercially available products thereof can be obtained. As the polymer material for an alignment layer, polyvinyl alcohol, polyimide, or a derivative thereof is preferable.

In addition, it is preferable that the alignment layer is subjected to a known rubbing treatment.

The thickness of the alignment layer is preferably 0.01 to 10 µm, and more preferably 0.01 to 1 µm.

Examples of a method for applying the composition include a curtain coating method, a dip coating method, a spin coating method, a printing coating method, a spray coating method, a slot coating method, a roll coating method, a slide coating method, a blade coating method, a gravure coating method, and a wire bar method. A single layer coating is preferable in a case of performing coating by any of these methods.

The coating film formed on the support is subjected to an alignment treatment to align the polymerizable liquid crystal compound and the infrared absorbing coloring agent in the coating film. The infrared absorbing coloring agent also tends to be aligned in a predetermined direction according to the alignment of the polymerizable liquid crystal compound.

The alignment treatment can be performed by drying the coating film at room temperature or heating the coating film. In a case of a thermotropic liquid crystal compound, a liquid crystal phase formed with the alignment treatment can generally be transferred by a change in a temperature or pressure. In a case of a lyotropic liquid crystal compound, the liquid crystal phase can also be transferred according to a compositional ratio such as the amount of a solvent.

Furthermore, the condition in a case of heating the coating film is not particularly limited, but the heating temperature is preferably 50° C. to 250° C., and more preferably 60° C. to 230° C., and the heating time is preferably 10 seconds to 10 minutes.

Moreover, before performing a curing treatment (light irradiation treatment) which will be described later, after heating the coating film, the coating film may be cooled, as desired. The cooling temperature is preferably 20° C. to 200° C., and more preferably 30° C. to 150° C.

Next, the coating film in which the polymerizable liquid crystal compound has been aligned is subjected to a curing treatment.

A method for the curing treatment to be carried out on the coating film in which the polymerizable liquid crystal compound has been aligned is not particularly limited, and examples thereof include a light irradiation treatment and a heating treatment. Among those, from the viewpoint of manufacturing suitability, the light irradiation treatment is preferable, and an ultraviolet ray-irradiation treatment is more preferable.

An irradiation condition for the light irradiation treatment is not particularly limited, but an irradiation dose of 50 to 1,000 mJ/cm² is preferable.

In the production method, the arrangement state of the infrared absorbing coloring agent, and the like can be adjusted by adjusting various conditions, and as a result, the optical characteristics of the optically anisotropic film can be adjusted.

(Suitable Aspect 2)

Other suitable aspects of the optically anisotropic film X include an optically anisotropic film X formed using a composition including a polymer and an infrared absorbing coloring agent.

Hereinafter, the components included in the composition will be described.

Suitable aspects of the infrared absorbing coloring agent are the same as mentioned above.

The type of the polymer is not particularly limited, but is preferably a reverse wavelength dispersible polymer. The reverse wavelength dispersible polymer means a polymer which is used to form an optically anisotropic film exhibiting reverse wavelength dispersibility.

One of suitable aspects of the polymer may be a polymer including one or more oligofluorene units selected from the group consisting of a repeating unit represented by Formula (7) and a repeating unit represented by Formula (8).

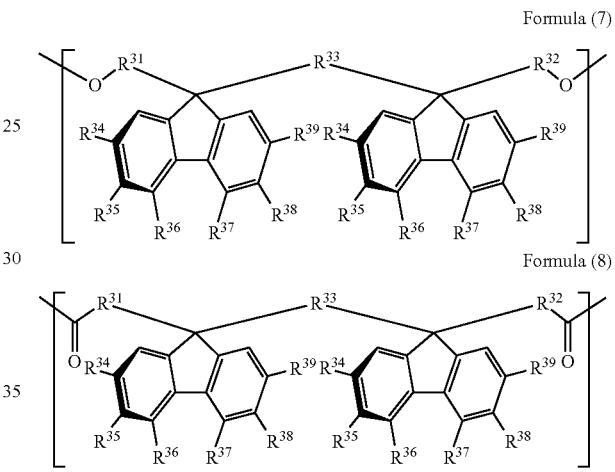

Formula (7)

Formula (8)

In Formulae (7) and (8), $R^{31}$ to $R^{33}$ each independently represent a single bond, or an alkylene group having 1 to 4 carbon atoms, which may have a substituent.

$R^{34}$ to $R^{39}$ each independently represent a hydrogen atom, an alkyl group having 1 to 10 carbon atoms, which may have a substituent, an aryl group having 4 to 10 carbon atoms, which may have a substituent, a heteroaryl group having 4 to 10 carbon atoms, which may have a substituent, an acyl group having 1 to 10 carbon atoms, which may have a substituent, an alkoxy group having 1 to 10 carbon atoms, which may have a substituent, an aryloxy group having 1 to 10 carbon atoms, which may have a substituent, an acyloxy group having 1 to 10 carbon atoms, which may have a substituent, an amino group which may have a substituent, a vinyl group having 1 to 10 carbon atoms, which may have a substituent, an ethynyl group having 1 to 10 carbon atoms, which may have a substituent, a sulfur atom having a substituent, a silicon atom having a substituent, a halogen atom, a nitro group, or a cyano group. It should be noted that at least two adjacent groups of $R^{34}$, . . . , or $R^{39}$ may be bonded to each other to form a ring.

In addition, each two of $R^{34}$'s, $R^{35}$'s, $R^{36}$'s, $R^{37}$'s, $R^{38}$'s, and $R^{39}$'s included in Formula (7) may be the same as or different from each other. Similarly, each two of $R^{34}$'s, $R^{35}$'s, $R^{36}$'s, $R^{37}$'s, $R^{38}$'s, and $R^{39}$'s included in Formula (8) may be the same as or different from each other.

The content of the oligofluorene unit included in the polymer is not particularly limited, but is preferably 1% to 70% by mole, and more preferably 10% to 40% by mole with respect to all the repeating units.

Other suitable aspects of the polymer include a polymer including a repeating unit of Formula (9) and a repeating unit of Formula (11).

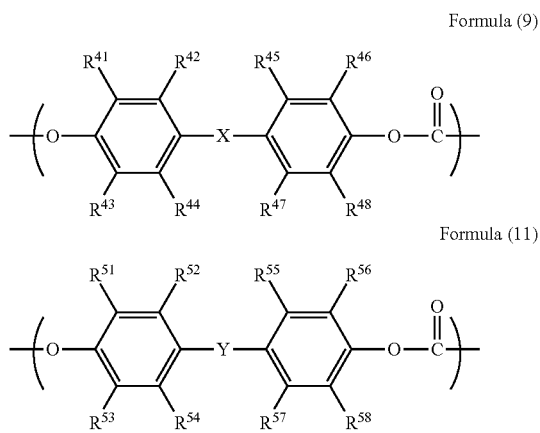

Formula (9)

Formula (11)

In Formula (9), $R^{41}$ to $R^{48}$ each independently represent a hydrogen atom, a halogen atom, or a hydrocarbon group having 1 to 6 carbon atoms.

X represents a group represented by Formula (10). In Formula (10), * represents a bonding position.

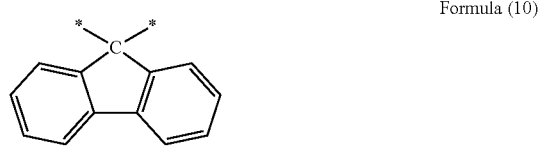 [SMILES: *C1(*)c2ccccc2-c2ccccc21]

Formula (10)

In Formula (11), $R^{51}$ to $R^{58}$ each independently represent a hydrogen atom, a halogen atom, or a hydrocarbon group having 1 to 22 carbon atoms.

Y represents —$C(R^{61})(R^{62})$—, a group represented by Formula (12), —$Si(R67)(R^{68})$—, —$SO_2$—, —S—, a divalent aliphatic hydrocarbon group, —$C(CH_3)_2$-phenylene group—$C(CH_3)_2$—, or —CO—O-L-O—CO—.

In Formula (12), * represents a bonding position.

Formula (12)

$R^{61}$, $R^{62}$, $R^{67}$, and $R^{68}$ each independently represent a hydrogen atom, a halogen atom, or a hydrocarbon group having 1 to 22 carbon atoms (for example, an aryl group having 6 to 10 carbon atoms).

$R^{63}$ to $R^{66}$ each independently represent a hydrogen atom or an alkyl group.

L represents a divalent aliphatic hydrocarbon group.

The content of the repeating unit represented by Formula (9) in the polymer is not particularly limited, but is preferably 30% to 90% by mole with respect to all the repeating units.

The content of the repeating unit represented by Formula (11) in the polymer is not particularly limited, but is preferably 10% to 70% by mole with respect to all the repeating units.

Other suitable aspects of the polymer include cellulose acylate.

As the cellulose acylate, a lower fatty acid ester of cellulose is preferable. The lower fatty acid means a fatty acid having 6 or less carbon atoms. The fatty acid preferably has 2 carbon atoms (cellulose acetate), 3 carbon atoms (cellulose propionate), or 4 carbon atoms (cellulose butyrate). In addition, mixed fatty acid esters such as cellulose acetate propionate and cellulose acetate butyrate may be used.

The acetylation degree of cellulose acetate is preferably 55.0% to 62.5%, more preferably 57.0% to 62.0%, and still more preferably 58.5% to 61.5%.

The acetylation degree means an amount of bonded acetic acid per unit mass of cellulose. The acetylation degree follows the measurement and computation of the acetylation degree in ASTM: D-817-91 (a test method for cellulose acetate and the like).

Furthermore, in a case where cellulose acylate is used as the polymer, additives such as a plasticizer, a deterioration inhibitor, a retardation enhancer, and an ultraviolet absorber may be used in combination.

Examples of the additive include those exemplified in JP2004-050516A.

The content of the polymer in the composition is not particularly limited, but is preferably 50% by mass or more, and more preferably 70% by mass or more with respect to the total solid content in the composition. An upper limit thereof is not particularly limited, but is often 97% by mass or less.

In addition, the total solid content in the composition does not include a solvent.

A method for producing the optically anisotropic film X using the composition is not particularly limited, and examples thereof include known methods.

Among those, from the viewpoint that it is easy to control the retardation, a method in which an unstretched film is formed using a composition including a polymer and an infrared absorbing coloring agent, and the obtained unstretched film is stretch-aligned in the thickness direction to form an optically anisotropic film.

(Suitable Aspect 3)

Other suitable aspects of the optically anisotropic film X include an optically anisotropic film X formed using a composition including a polymer (specific polymer) having an infrared absorbing coloring agent residue.

As mentioned above, the infrared absorbing coloring agent residue means a group obtained by removing any hydrogen atom from an infrared absorbing coloring agent.

Examples of the infrared absorbing coloring agent capable of forming an infrared absorbing coloring agent residue include the infrared absorbing coloring agent described in (Suitable Aspect 1) above.

Furthermore, the composition may include the polymer described in (Suitable Aspect 2) above.

A method for producing the optically anisotropic film X using the composition is not particularly limited, and examples thereof include known methods.

Among those, from the viewpoint that it is easy to control the retardation, a method in which an unstretched film is formed using a composition including an infrared absorbing coloring agent and a polymer, and the obtained unstretched film is stretch-aligned in the thickness direction to form an optically anisotropic film X.

<Uses>

The above-mentioned optically anisotropic film X can be applied to various uses.

The optically anisotropic film X may be used as a laminate including another optically anisotropic film.

The type of the other optically anisotropic film is not particularly limited, and examples thereof include a λ/2 plate and a λ/4 plate.

The λ/4 plate is a plate having a function of converting linearly polarized light at a specific wavelength into circularly polarized light (or converting circularly polarized light into linearly polarized light). More specifically, the λ/4 plate is a plate in which an in-plane retardation Re at a predetermined wavelength of λ nm is λ/4 (or an odd number of times thereof).

The in-plane retardation (Re(550)) of the λ/4 plate at a wavelength of 550 nm may have an error of about 25 nm from an ideal value (137.5 nm) at a center, and is, for example, preferably 110 to 160 nm, and more preferably 120 to 150 nm.

As the λ/4 plate, a wide band λ/4 plate in which a λ/2 plate and a λ/4 plate are laminated may be used.

The λ/2 plate refers to an optically anisotropic film in which the in-plane retardation Re(λ) at a specific wavelength of λ nm satisfies Re(λ)≈λ/2. This formula only needs to be satisfied at any wavelength (for example, 550 nm) in the visible region. Above all, it is preferable that the in-plane retardation Re(550) at a wavelength of 550 nm satisfies the following relationship.

$$210\ \text{nm} \leq Re(550) \leq 300\ \text{nm}$$

(Optically Anisotropic Film Y)

In addition, one of other suitable aspects of the optically anisotropic film may be an optically anisotropic film formed of a composition including a liquid crystal compound and an infrared absorbing coloring agent (hereinafter also referred to as an "optically anisotropic film Y"), in which the optically anisotropic film Y satisfies a relationship of Formula (Y1) which will be described later, and an absorption at a wavelength of 700 to 900 nm in the fast axis direction of the optically anisotropic film Y is larger than an absorption at a wavelength of 700 to 900 nm in the slow axis direction of the optically anisotropic film Y (corresponding to an example of the second embodiment of the present invention). The optically anisotropic film Y is affected by an absorption at a wavelength of 700 to 900 nm, has a large in-plane retardation in a long wavelength range, and has excellent reverse wavelength dispersibility in an in-plane-direction phase difference.

As one of feature points of the optically anisotropic film Y of an embodiment of the present invention, it may be mentioned that the absorption characteristics at a wavelength of 700 to 900 nm are controlled.

Figure 5:
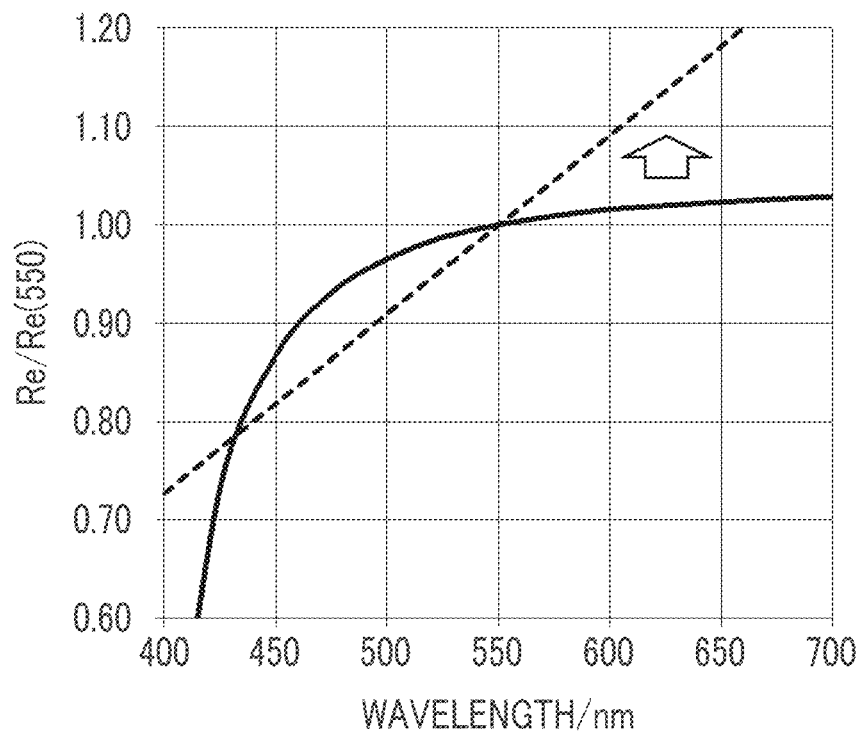
FIG. 5 is a view showing a comparison between the wavelength dispersion of an optically anisotropic film exhibiting reverse wavelength dispersibility in the related art and the wavelength dispersion of an ideal phase difference.

First, FIG. 5 shows the wavelength dispersion characteristics of a phase difference (Re(λ)) at each wavelength in the visible region with a phase difference (Re(550 nm)) at a measurement wavelength of 550 nm being normalized as 1. For example, the above-mentioned ideal λ/4 plate has "negative dispersion" characteristics in that a phase difference increase as a measurement wavelength increases since the phase difference is in a relationship in proportional with the measurement wavelength as indicated by a dotted line in FIG. 5. In contrast, with regard to an optically anisotropic film exhibiting reverse wavelength dispersibility in the related art, the wavelength dispersion characteristics are at positions overlapping an ideal curve indicated by a dotted line in the short wavelength range but show a tendency to deviate from the ideal curve in the long wavelength range, as indicated by a solid line in FIG. 5.

In the optically anisotropic film Y, it is possible to approximate the optical characteristics in the long wavelength range to the ideal curve as indicated by an outlined arrow by controlling the optical characteristics at a wavelength of 700 to 900 nm.

In the optically anisotropic film Y, the absorption at a wavelength of 700 to 900 nm in the fast axis direction is larger than the absorption at a wavelength of 700 to 900 nm in the slow axis direction. Hereinafter, such absorption characteristics are also referred to as absorption characteristics Y. As described in detail later, it may be one of means for achieving the absorption characteristics Y, for example, to arrange the axial direction having a high absorbance of the infrared absorbing coloring agent in the optically anisotropic film Y to be in parallel with the fast axis direction.

In the optically anisotropic film exhibiting the absorption characteristics Y, the ordinary ray refractive index is further reduced, as compared with the optically anisotropic film not having absorption characteristics Y.

Figure 6:
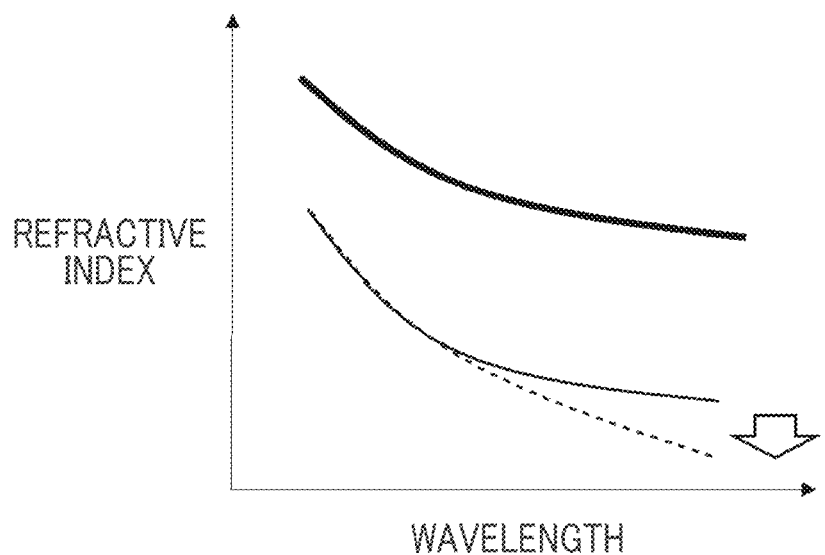
FIG. 6 is a view showing a comparison of the wavelength dispersion between an extraordinary ray refractive index ne and an ordinary ray refractive index no depending on the presence or absence of predetermined absorption characteristics.

Specifically, FIG. 6 is a view showing a comparison of the wavelength dispersion between an extraordinary ray refractive index ne and an ordinary ray refractive index no depending on the presence or absence of the absorption characteristics Y. In FIG. 6, the thick line indicates a curve of the extraordinary ray refractive index ne in the absence of the absorption characteristics Y, and the solid line indicates a curve of the ordinary ray refractive index no in the absence of the absorption characteristics Y. In contrast, in the optically anisotropic film Y having the absorption characteristics Y, a value of the ordinary ray refractive index no in the long wavelength range in the visible region is further reduced as indicated by a broken line under the influence derived from an absorption at a wavelength of 700 to 900 nm as shown in FIG. 4. As a result, a birefringence Δn which is a difference between the extraordinary ray refractive index ne and the ordinary ray refractive index no is larger in the long wavelength range in the visible region, and thus, the behavior indicated by an arrow shown in FIG. 5 is accomplished.

The optically anisotropic film Y satisfies a relationship of Formula (Y1).

$$Re(450)/Re(550) < 1.00 \quad \text{Formula (Y1)}$$

Re(450) represents an in-plane retardation of the optically anisotropic film Y at a wavelength of 450 nm and Re(550) represents an in-plane retardation of the optically anisotropic film Y at a wavelength of 550 nm.

Among those, Re(450)/Re(550) is preferably 0.97 or less, more preferably 0.92 or less, and still more preferably 0.88 or less. A lower limit thereof is not particularly limited, but is often 0.75 or more.

The Re(650)/Re(550) of the optically anisotropic film Y is not particularly limited, but is preferably 1.05 or more, more preferably 1.08 or more, and still more preferably 1.10 or more. An upper limit thereof is not particularly limited, but is preferably 1.25 or less, and more preferably 1.20 or less.

Re(650)/Re(550) is a ratio of Re(650) to Re(550).

Furthermore, Re(650) represents an in-plane retardation of the optically anisotropic film Y at a wavelength of 650 nm.

Re(550) of the optically anisotropic film Y is not particularly limited, but from the viewpoint that the optically anisotropic film is useful as a λ/4 plate, Re(550) is preferably 110 to 160 nm, and more preferably 120 to 150 nm.

The thickness of the optically anisotropic film Y is not particularly limited, but is preferably 10 μm or less, more preferably 0.5 to 8.0 μm, and still more preferably 0.5 to 6.0 μm from the viewpoint of reducing the thickness.

In addition, in the present specification, the thickness of the optically anisotropic film Y is intended to mean an average thickness of the optically anisotropic film Y. The average thickness is determined by measuring the thickness at any five or more points of the optically anisotropic film Y and obtaining an arithmetic mean of the values.

In the optically anisotropic film Y, the absorption at a wavelength of 700 to 900 nm in the fast axis direction of the optically anisotropic film Y (hereinafter also referred to as an "absorption F") is larger than the absorption at a wavelength of 700 to 900 nm in the slow axis direction of the optically anisotropic film Y (hereinafter also referred to as an "absorption S").

An expression, "the absorption F is larger than the absorption S", is intended to mean that a maximum absorbance in a wavelength range of 700 to 900 nm of an absorption spectrum obtained upon irradiation of the optically anisotropic film Y with polarized light in parallel with the fast axis of the optically anisotropic film Y is larger than a maximum absorbance in a wavelength range of 700 to 900 nm of an absorption spectrum obtained upon irradiation of the optically anisotropic film Y with polarized light in parallel with the slow axis of the optically anisotropic film Y.

In addition, the measurement can be carried out using a spectrophotometer (MPC-3100 manufactured by SHIMADZU Corporation) equipped with a polarizer for infrared rays.

In addition, the anisotropy of the absorption as described above can be realized by using the above-mentioned infrared absorbing coloring agent. In particular, it is possible to make the absorption F larger than the absorption S by using a dichroic infrared absorbing coloring agent to set the axial direction having a higher absorbance of the coloring agent to be in parallel with the fast axis direction of the optically anisotropic film.

In the optically anisotropic film Y, the degree $S_0$ of alignment order of the optically anisotropic film Y at the maximum absorption wavelength in a wavelength range of 700 to 900 nm of the infrared absorbing coloring agent is not particularly limited, and is often more than −0.50 and −0.10 or less. In a case where the degree $S_0$ of alignment order is large, it is possible to improve the reverse wavelength dispersibility of the optically anisotropic film Y even with a reduction in the amount of the infrared absorbing coloring agent. As a result, from the viewpoint that the brightness of an organic electroluminescence (EL) display device is more excellent in a case the optically anisotropic film Y is applied as an antireflection film of the organic EL display device, it is preferable to satisfy a relationship of Formula (Y2).

$$-0.50 < S_0 < -0.15 \qquad \text{Formula (Y2)}$$

Among those, the degree $S_0$ of alignment order is more preferably −0.40 to −0.20, and still more preferably −0.30 to −0.20.

The degree $S_0(\lambda)$ of alignment order of the optically anisotropic film Y at a wavelength of λ nm is a value represented by Formula (Y3).

$$S_0(\lambda) = \{A_p - A_v\}/(A_p + 2A_v) \qquad \text{Formula (Y3)}$$

In Formula (Y3), $A_p$ represents an absorbance for light which is polarized in the direction in parallel with a slow axis direction of the optically anisotropic film Y. $A_v$ represents an absorbance for light which is polarized in a direction perpendicular to the slow axis direction of the optically anisotropic film Y.

The degree $S_0(\lambda)$ of alignment order of the optically anisotropic film Y can be determined by measuring a polarized light absorption of the optically anisotropic film Y. In addition, the measurement can be carried out using a spectrophotometer (MPC-3100 manufactured by SHIMADZU Corporation) equipped with a polarizer for infrared rays. λ is a maximum absorption wavelength of an absorption spectrum at a wavelength of 700 to 900 nm obtained by measuring the absorption of the optically anisotropic film Y.

(Optically Anisotropic Film Z)

In addition, one of other suitable aspects of the optically anisotropic film may be an optically anisotropic film formed of a composition including a liquid crystal compound and an infrared absorbing coloring agent (hereinafter also referred to as an "optically anisotropic film Z"), in which the degree $S_0$ of alignment order of the optically anisotropic film Z at the maximum absorption wavelength in a wavelength range of 700 to 900 nm of the infrared absorbing coloring agent satisfies a relationship of Formula (Z1) which will be described later, and an absorption at a wavelength of 700 to 900 nm in the fast axis direction of the optically anisotropic film Z is larger than an absorption at a wavelength of 700 to 900 nm in the slow axis direction of the optically anisotropic film Z (corresponding to another example of the second embodiment of the present invention). The optically anisotropic film Z is affected by the absorption at a wavelength of 700 to 900 nm, has a large in-plane retardation in a long wavelength range, and has excellent reverse wavelength dispersibility in an in-plane-direction phase difference.

A reason why the optically anisotropic film Z exhibits excellent reverse wavelength dispersibility is the same as the above-mentioned reason with the optically anisotropic film Y.

In the optically anisotropic film Z, the degree $S_0$ of alignment order of the optically anisotropic film at the maximum absorption wavelength in a wavelength range of 700 to 900 nm of the infrared absorbing coloring agent satisfies a relationship of Formula (Z1).

$$-0.50 < S_0 < -0.15 \qquad \text{Formula (Z1)}$$

Among those, the degree $S_0$ (λ) of alignment order is more preferably −0.40 to −0.20, and still more preferably −0.30 to −0.20.

A method for measuring the degree $S_0$ (λ) of alignment order of the optically anisotropic film Z is the same as that described for the optically anisotropic film Y mentioned above.

In the optically anisotropic film Z, the absorption at a wavelength of 700 to 900 nm in the fast axis direction of the optically anisotropic film Z (absorption F) is larger than the absorption at a wavelength of 700 to 900 nm in the slow axis direction of the optically anisotropic film Z (absorption S).

An expression, "the absorption F is larger than the absorption S", is intended to mean that a maximum absorbance in a wavelength range of 700 to 900 nm of an absorption spectrum obtained upon irradiation of the optically anisotropic film Z with polarized light in parallel with the fast axis of the optically anisotropic film is larger than a maximum absorbance in a wavelength range of 700 to 900 nm of an absorption spectrum obtained upon irradiation of the optically anisotropic film with polarized light in parallel with the slow axis of the optically anisotropic film Z.

In addition, the measurement can be carried out using a spectrophotometer (MPC-3100 manufactured by SHIMADZU Corporation) equipped with a polarizer for infrared rays.

In addition, the anisotropy of the absorption as described above can be realized by using the infrared absorbing coloring agent. In particular, it is possible to make the absorption F larger than the absorption S by using a dichroic infrared absorbing coloring agent to set the axial direction having a higher absorbance of the coloring agent to be in parallel with the fast axis direction of the optically anisotropic film Z.

The optically anisotropic film Z preferably satisfies a relationship of Formula (Z2).

$$Re(450)/Re(550)<1 \qquad \text{Formula (Z2)}$$

Re(450) represents an in-plane retardation of the optically anisotropic film at a wavelength of 450 nm and Re(550) represents an in-plane retardation of the optically anisotropic film at a wavelength of 550 nm.

Among those, Re(450)/Re(550) is preferably 0.97 or less, more preferably 0.92 or less, and still more preferably 0.88 or less. A lower limit thereof is not particularly limited, but is often 0.75 or more.

Re(650)/Re(550) of the optically anisotropic film Z is not particularly limited, but is preferably 1.05 or more, more preferably 1.08 or more, and still more preferably 1.10 or more. An upper limit thereof is not particularly limited, but is preferably 1.25 or less, and more preferably 1.20 or less.

Re(650)/Re(550) is a ratio of Re(650) to Re(550).

Furthermore, Re(650) represents an in-plane retardation of the optically anisotropic film Z at a wavelength of 650 nm.

Re(550) of the optically anisotropic film Z is not particularly limited, but from the viewpoint that the optically anisotropic film is useful as a λ/4 plate, Re(550) is preferably 110 to 160 nm, and more preferably 120 to 150 nm.

The thickness of the optically anisotropic film Z is not particularly limited, but is preferably 10 μm or less, more preferably 0.5 to 8.0 μm, and still more preferably 0.5 to 6.0 μm from the viewpoint of reducing the thickness.

The method for measuring a thickness of the optically anisotropic film Z is as described for the above-mentioned optically anisotropic film Y.

Examples of the liquid crystal compound and the infrared absorbing coloring agent in the composition used for forming the optically anisotropic film Y and the optically anisotropic film Z include the liquid crystal compound and the infrared absorbing coloring agent used for forming the optically anisotropic film X, respectively.

As a method for producing the optically anisotropic film Y and the optically anisotropic film Z, a method in which a composition including a liquid crystal compound having a polymerizable group and an infrared absorbing coloring agent is applied to form a coating film, the coating film is subjected to an alignment treatment to align the polymerizable liquid crystal compound, and the obtained coating film is subjected to a curing treatment (irradiation with ultraviolet rays (a light irradiation treatment) or a heating treatment) to form an optically anisotropic film is preferable.

As the optically anisotropic film Y and the optically anisotropic film Z, an optically anisotropic film formed by horizontally aligning and thus fixing a liquid crystal compound, which includes an infrared absorbing coloring agent, is preferable.

Hereinafter, the procedure of the method will be described in detail.

First, the composition is applied onto a support to form a coating film and the coating film is subjected to an alignment treatment to align the polymerizable liquid crystal compound.

The composition to be used includes a polymerizable liquid crystal compound. The definition of the polymerizable liquid crystal compound is the same as mentioned above.

Examples of the support used include the support used for forming the above-mentioned optically anisotropic film X.

Moreover, an alignment layer may be arranged on the support, as desired. Examples of the alignment layer include an alignment layer to be used for forming the optically anisotropic film X.

Examples of a method for coating the composition include a coating method to be used in a case of forming the optically anisotropic film X.

The coating film formed on the support is subjected to an alignment treatment to align the polymerizable liquid crystal compound in the coating film. In particular, it is preferable that the polymerizable liquid crystal compound is horizontally aligned. The infrared absorbing coloring agent also tends to be aligned in a predetermined direction according to the alignment of the polymerizable liquid crystal compound.

The alignment treatment can be performed by drying the coating film at room temperature or heating the coating film. In a case of a thermotropic liquid crystal compound, a liquid crystal phase formed with the alignment treatment can generally be transferred by a change in a temperature or pressure. In a case of a lyotropic liquid crystal compound, the liquid crystal phase can also be transferred according to a compositional ratio such as the amount of a solvent.

Furthermore, the condition in a case of heating the coating film is not particularly limited, but the heating temperature is preferably 50° C. to 250° C., and more preferably 50° C. to 150° C., and the heating time is preferably 10 seconds to 10 minutes.

Moreover, before performing a curing treatment (light irradiation treatment) which will be described later, after heating the coating film, the coating film may be cooled, as desired. The cooling temperature is preferably 20° C. to 200° C., and more preferably 30° C. to 150° C.

Next, the coating film in which the polymerizable liquid crystal compound has been aligned is subjected to a curing treatment.

A method for the curing treatment to be carried out on the coating film in which the polymerizable liquid crystal compound has been aligned is not particularly limited, and examples thereof include a light irradiation treatment and a heating treatment. Among those, from the viewpoint of manufacturing suitability, the light irradiation treatment is preferable, and an ultraviolet ray-irradiation treatment is more preferable.

An irradiation condition for the light irradiation treatment is not particularly limited, but an irradiation dose of 50 to 1,000 mJ/cm$^2$ is preferable.

(Circularly Polarizing Plate)

The optically anisotropic film X can be applied to a circularly polarizing plate. More specifically, examples of a configuration of the circularly polarizing plate include an aspect involving an optically anisotropic film X, a λ/4 plate, and a polarizer. Furthermore, in the circularly polarizing plate, the laminating order of the optically anisotropic film X, the λ/4 plate, and the polarizer is not particularly limited, and for example, the optically anisotropic film X, the λ/4 plate, and the polarizer may be laminated in this order or the λ/4 plate, the optically anisotropic film X, and the polarizer may be laminated in this order.

Furthermore, as the λ/4 plate, the optically anisotropic film Y and the optically anisotropic film Z, each mentioned above, may be used.

The polarizer only needs to be a member (linear polarizer) having a function of converting light into specific linearly polarized light, and an absorptive type polarizer can be usually used.

Examples of the absorptive type polarizer include an iodine-based polarizer, a dye-based polarizer using a dichroic dye, and a polyene-based polarizer. The iodine-based polarizer and the dye-based polarizer are classified into a coating type polarizer and a stretching type polarizer, both of which can be applied, but a polarizer which is manufactured by allowing polyvinyl alcohol to adsorb iodine or a dichroic dye and performing stretching is preferable.

A relationship between the absorption axis of the polarizer and the slow axis of the λ/4 plate is not particularly limited, but an angle formed by the absorption axis of the polarizer and the slow axis of the λ/4 plate is preferably 45°±10°.

(Display Device)

The optically anisotropic film X may be included in the display device. That is, examples of more specific uses of the optically anisotropic film X include an optical compensation film for optical compensation of a liquid crystal cell, and an antireflection film for use in a display device such as an organic electroluminescence display device.

Among those, preferred aspects of the optically anisotropic film X include a circularly polarizing plate which includes the optically anisotropic film X and a polarizer, as described above. This circularly polarizing plate can be suitably used as the antireflection film. That is, it is possible to further suppress a reflection tint in a display device including a display element (for example, an organic electroluminescence display element) and a circularly polarizing plate arranged on the display element.

In addition, the optically anisotropic film X is suitably used in an optical compensation film of an in plane switching (IPS) type liquid crystal display device, and can improve a tint change as viewed from a tilt direction and a light leakage upon black display.

EXAMPLES

Hereinafter, the features of the present invention will be described in more details with reference to Examples and Comparative Examples. The materials, the amounts of materials used, the proportions, the treatment details, the treatment procedure, and the like shown in Examples below can be appropriately modified as long as the modifications do not depart from the spirit of the present invention. Therefore, the scope of the present invention should not be construed as being limited to specific examples shown below.

<Synthesis of Coloring Agent>

(Synthesis of Compound a-2)

A compound a-2 was synthesized according to the following scheme.

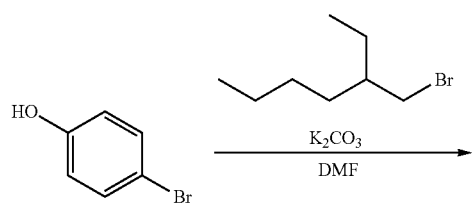

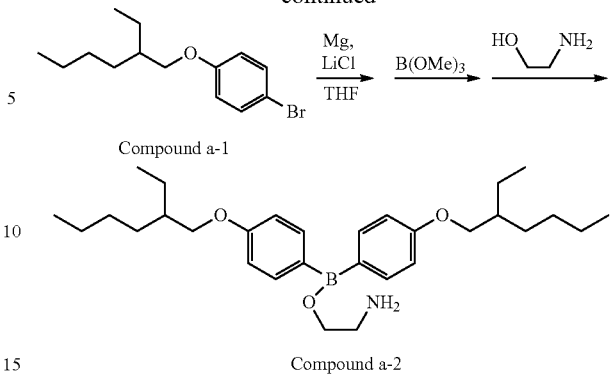

Compound a-1

Compound a-2

4-Bromophenol (50.0 g, 258 mmol), 2-ethylhexyl bromide (58.2 g, 336 mmol), potassium carbonate (93.0 g, 673 mmol), and N,N-dimethylformamide (250 ml) were mixed at room temperature. The temperature of the obtained mixture was raised to 105° C., the mixture was stirred for 10 hours, then the temperature was lowered to room temperature, and the inorganic salts in the mixed solution were removed by filtration. Ethyl acetate (300 ml) and 1 N aqueous hydrochloric acid (300 ml) were added to the mixed solution to perform liquid separation extraction. The organic layer was washed with each of distilled water (300 ml) and a saturated aqueous sodium bicarbonate solution (300 ml), and the obtained organic layer was dried over magnesium sulfate. Thereafter, magnesium sulfate was removed from the obtained solution by filtration, and the solvent was evaporated from the solution under reduced pressure. The obtained crude product was purified by silica gel column chromatography using ethyl acetate-hexane as a solvent to obtain a compound a-1 (72.2 g, 253 mmol) in the form of an oil (yield: 98.1%). The structure of the compound a-1 was identified by $^1$H-nuclear magnetic resonance (NMR).

$^1$H-NMR (solvent: CDCl$_3$) δ (ppm): 0.92 (m, 6H), 1.38 (m, 8H), 1.69 (m, 1H), 3.79 (d, 2H), 6.77 (m, 2H), 7.29 (m, 2H)

Magnesium (3.75 g, 154 mmol), lithium chloride (3.27 g, 105 mmol), and tetrahydrofuran (160 ml) were mixed at room temperature under a dry nitrogen atmosphere. The temperature of the obtained mixture was raised to 63° C., and a mixture of the compound a-1 (40.0 g, 140 mmol) and tetrahydrofuran (40 ml) was added dropwise thereto. The obtained mixture was cooled to room temperature, and then a mixture of trimethoxyborane (7.29 g, 70.0 mmol) and tetrahydrofuran (20 ml) was added dropwise thereto. The temperature of the obtained mixture was raised to 50° C., the mixture was stirred for 2 hours, and then the temperature was lowered to room temperature. Distilled water (20 ml) was added to the obtained mixed solution, and then ethyl acetate (200 ml) and 1 N aqueous hydrochloric acid (200 ml) were added thereto to perform a liquid separation extraction. The organic layer was washed twice with saturated brine (200 ml), and the obtained organic layer was dried over magnesium sulfate. Thereafter, magnesium sulfate was removed from the obtained solution by filtration, and the solvent was evaporated from the solution under reduced pressure. The obtained crude product was purified by silica gel column chromatography using ethyl acetate-hexane as a solvent. Toluene (100 ml) and ethanolamine (6.42 g, 105 mmol) were added to the obtained crude product, and the mixture was stirred at room temperature for 10 minutes. The solvent and excess ethanolamine were evaporated under reduced pressure to obtain a compound a-2 (23.4 g, 48.7 mmol) in the form of an oil (yield: 69.6%). The structure of the compound a-2 was identified by $^1$H-NMR.

$^1$H-NMR (solvent: CDCl$_3$) δ (ppm): 0.91 (m, 12H), 1.40 (m, 16H), 1.70 (m, 2H), 2.83 (m, 2H), 3.84 (m, 6H), 4.13 (m, 2H), 6.83 (m, 4H), 7.29 (m, 2H)

(Synthesis of Compound a-5)

A compound a-5 was synthesized according to the following scheme.

a white solid (yield: 52.8%). The structure of the compound a-4 was identified by $^1$H-NMR.

$^1$H-NMR (solvent: CDCl$_3$) δ (ppm): 2.98 (t, 2H), 3.74 (m, 6H), 3.87 (m, 2H), 4.17 (m, 2H), 4.33 (m, 2H), 4.44 (t, 2H), 5.82 (dd, 1H), 6.13 (dd, 1H), 6.42 (dd, 1H), 6.79 (m, 2H), 6.91 (m, 2H), 7.19 (m, 2H), 7.95 (m, 2H)

The compound a-4 (4.46 g, 10.0 mmol), cyclohexanedicarboxylic acid dichloride (6.29 g, 30.0 mmol), dibutylhydroxytoluene (66.0 mg, 0.30 mmol), and tetrahydrofuran

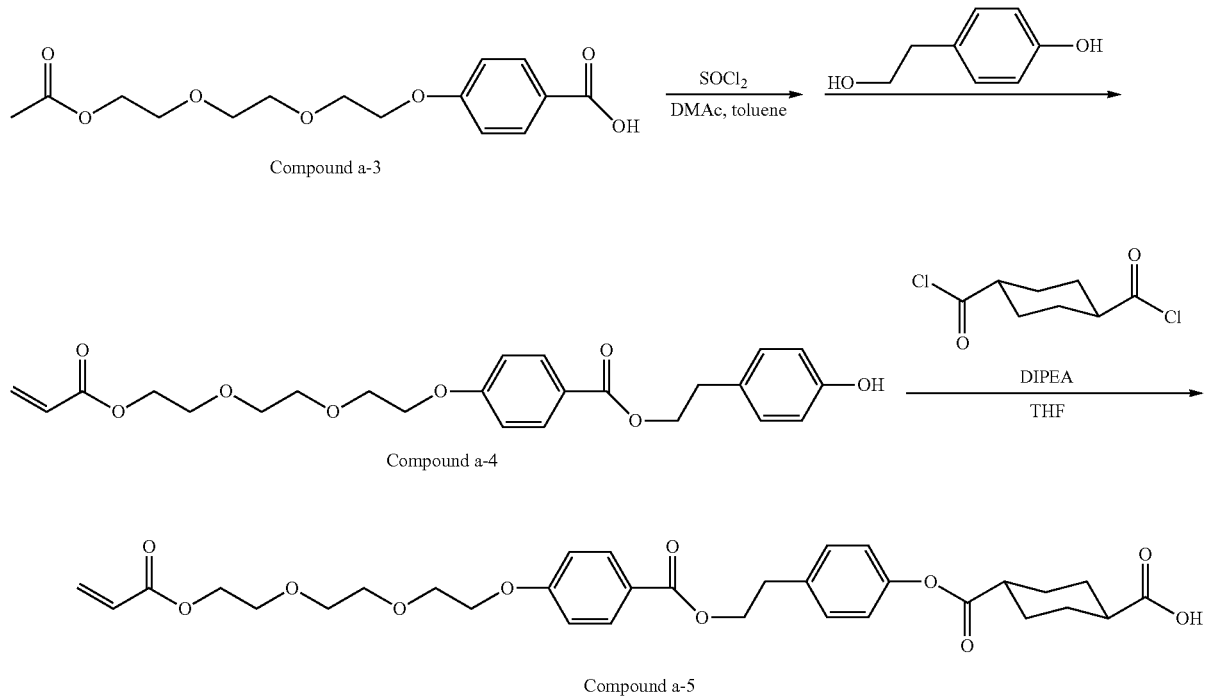

A compound a-3 was synthesized according to the scheme for a compound P1-1 described in paragraphs 0088 to 0091 of WO2018/124198A.

The compound a-3 (10.0 g, 30.8 mmol), 2,2,6,6-tetramethylpiperidin-1-oxyl (12.0 mg, 0.77 mmol), toluene (20 ml), and N,N-dimethylacetamide (5.5 ml) were mixed at room temperature. The obtained mixture was cooled to −5° C., and thionyl chloride (3.52 g, 29.6 mmol) was added dropwise to the mixture. The obtained mixed solution was stirred at an internal temperature of −5° C. to 3° C. for 1 hour, and then a mixture of 2-(4-hydroxyphenyl)ethanol (3.55 g, 25.7 mmol) and N,N-dimethylacetamide (13.0 ml) was added dropwise thereto. The temperature of the obtained mixed solution was raised to 52° C., the mixed solution was stirred for 7 hours, and then the temperature was lowered to room temperature. Distilled water and toluene were added to the mixed solution to perform liquid separation extraction. The organic layer was washed with 1 N aqueous hydrochloric acid, then washed twice with a saturated aqueous sodium bicarbonate solution, and further washed with saturated saline, and the obtained organic layer was dried over magnesium sulfate. Thereafter, magnesium sulfate was removed from the obtained solution by filtration, and the solvent was evaporated from the solution under reduced pressure. The obtained crude product was purified by silica gel column chromatography using ethyl acetate-hexane as a solvent to obtain a compound a-4 (6.03 g, 13.6 mmol) in the form of (67.0 ml) were mixed at room temperature. The obtained mixed solution was cooled to 3° C., N,N-diisopropylethylamine (2.59 g, 20.0 mmol) was added dropwise thereto, and the obtained mixed solution was stirred for 1 hour. Methanesulfonic acid (130 µl) was added to the obtained mixed solution, the insoluble matter was filtered, and then 10% aqueous potassium carbonate (12.5 g) was added thereto to perform liquid separation extraction. The organic layer was washed with 17% aqueous potassium carbonate (20.4 g), and the obtained organic layer was dried over magnesium sulfate. Thereafter, magnesium sulfate was removed from the obtained solution by filtration, and the solvent was evaporated from the solution under reduced pressure. The obtained crude product was purified by silica gel column chromatography using ethyl acetate-hexane as a solvent to obtain a compound a-5 (2.06 g, 3.43 mmol) in the form of a white solid (yield: 34. 3%). The structure of the compound a-5 was identified by $^1$H-NMR.

$^1$H-NMR (solvent: CDCl$_3$) δ (ppm): 1.63 (m, 4H), 2.38 (m, 6H), 3.05 (t, 2H), 3.74 (m, 6H), 3.87 (m, 2H), 4.18 (m, 2H), 4.32 (m, 2H), 4.49 (t, 2H), 5.82 (dd, 1H), 6.15 (dd, dd, 1H), 6.42 (dd, 1H), 6.92 (m, 2H), 7.02 (m, 2H), 7.29 (m, 2H), 7.95 (m, 2H)

(Synthesis of Infrared Absorbing Coloring Agent IR-1)

An infrared absorbing coloring agent IR-1 was synthesized according to the following scheme.

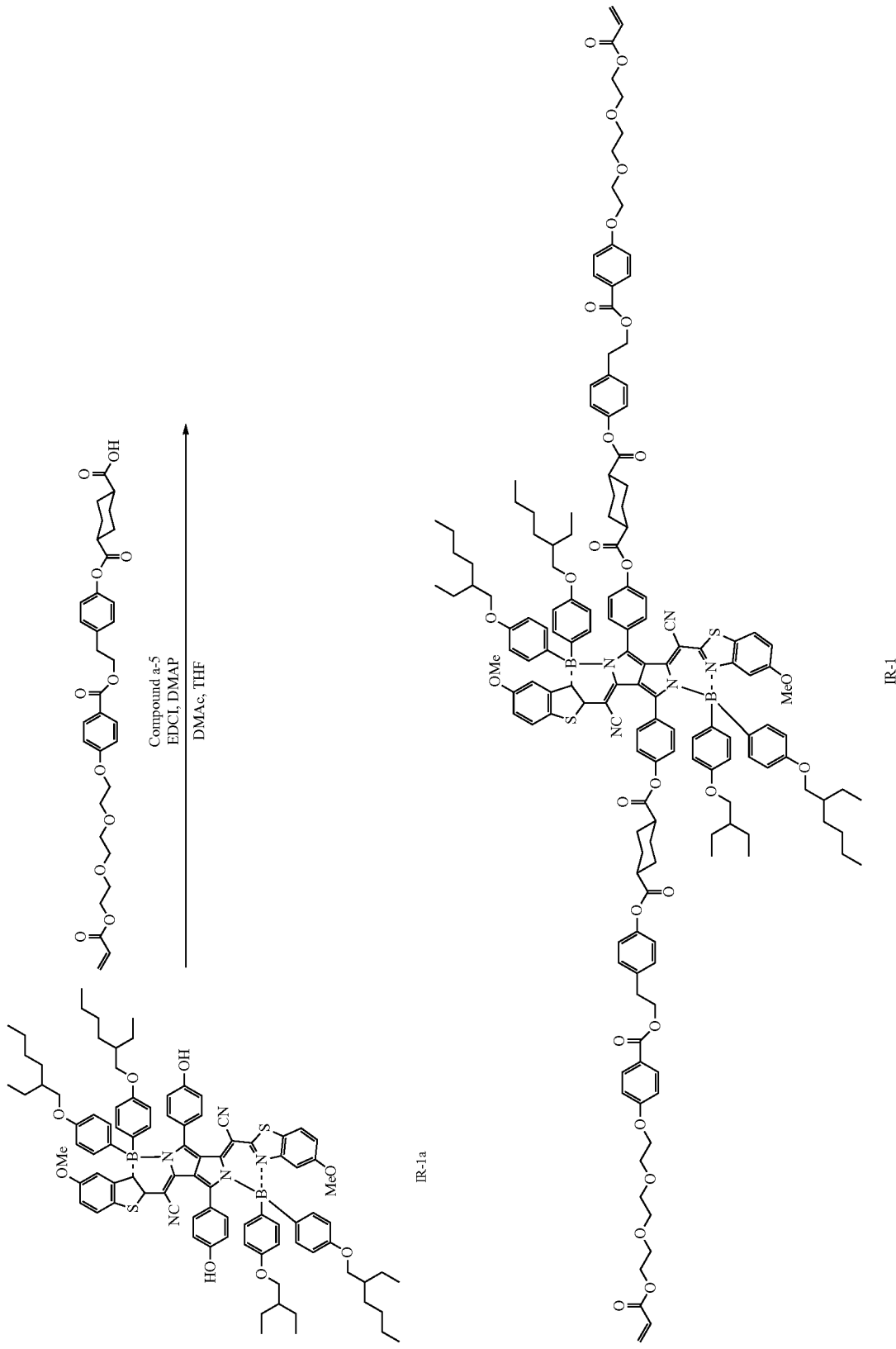

A complex IR-1a was synthesized according to the method for synthesizing a compound A-15 described in paragraphs 0271 and 0272 of WO2017/146092A, using the compound a-2 instead of the 2-aminoethyl diphenylborinate ester.

The complex IR-1a (4.47 g, 2.92 mmol), the compound a-5 (5.41 g, 9.04 mmol), 1-ethyl-3-(3-dimethylaminopropyl) carbodiimide hydrochloride (3.35 g, 17.5 mmol), N,N-dimethylaminopyridine (36.0 mg, 0.29 mmol), dibutylhydroxytoluene (64.0 mg, 0.29 mmol), N,N-dimethylacetamide (60.0 ml), and tetrahydrofuran (60.0 ml) were mixed at room temperature. The temperature of the obtained mixed solution was raised to 70° C., the mixed solution was stirred for 2 hours, and then the temperature was lowered to room temperature. Methanol (600 ml) was added dropwise to the mixed solution, and the precipitated crystals were recovered by filtration. The obtained crude product was purified by silica gel column chromatography using ethyl acetate-chloroform as a solvent to obtain an infrared absorbing coloring agent IR-1 (6.94 g, 2.58 mmol) in the form of a green solid (yield: 88.3%). The structure of the infrared absorbing coloring agent IR-1 was identified by $^1$H-NMR.

$^1$H-NMR (solvent: $CDCl_3$) δ (ppm): 0.93 (m, 24H), 1.57 (m, 44H), 2.31 (m, 8H), 2.61 (m, 4H), 3.05 (t, 4H), 3.33 (s, 6H), 3.80 (m, 24H), 4.19 (m, 4H), 4.34 (m, 4H), 4.50 (t, 4H), 5.82 (dd, 2H), 6.15 (dd, 2H), 6.42 (dd, 2H), 6.70 (m, 20H), 6.93 (m, 411), 7.05 (m, 4H), 7.15 (m, 8H), 7.30 (m, 6H), 7.96 (m, 4H)

Example 1

An undercoat layer coating liquid having the following composition was continuously applied onto a cellulose acylate film T1 ("TD60UL" (manufactured by FUJIFILM Corporation)) with a wire bar of #3.2. A support having the coating film formed thereon was dried with warm air at 40° C. for 60 seconds and nitrogen-purged to create an atmosphere with an oxygen concentration of 0.01% by volume or less, and the coating film was irradiated with ultraviolet rays at an irradiation dose of 40 mJ/cm$^2$ using a high-pressure mercury lamp to form an undercoat layer.

| (Undercoat Layer Coating Liquid) | |
|---|---|
| The following compound X-1 | 100 parts by mass |
| Photopolymerization initiator (Irg-127) | 3 parts by mass |
| The following fluorine-containing compound F-1 | 0.1 parts by mass |
| Ethanol | 240.4 parts by mass |

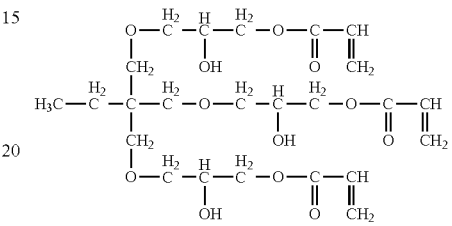

A fluorine compound F-1 (hereinafter "90" and "10" in the repeating units in the chemical formulae represent a content (% by mass) of each repeating unit with respect to all the repeating units).

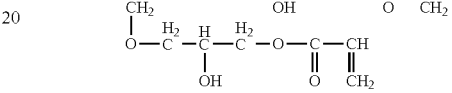

The following coating liquid for an optically anisotropic film was prepared.

| | |
|---|---|
| The following liquid crystal compound L-1 | 42.5 parts by mass |
| The following liquid crystal compound L-2 | 42.5 parts by mass |
| The following liquid crystal compound L-3 | 5.0 parts by mass |
| Infrared absorbing coloring agent IR-1 | 10.0 parts by mass |
| The following photopolymerization initiator FI-1 | 5.0 parts by mass |
| The fluorine-containing compound F-1 | 0.3 parts by mass |
| The following fluorine-containing compound F-2 | 0.3 parts by mass |
| Monomer K1 | 8.0 parts by mass |
| The following additive A-1 | 4.5 parts by mass |
| Cyclopentanone | 311.1 parts by mass |
| Methanol | 9.7 parts by mass |

Liquid crystal compound L-1

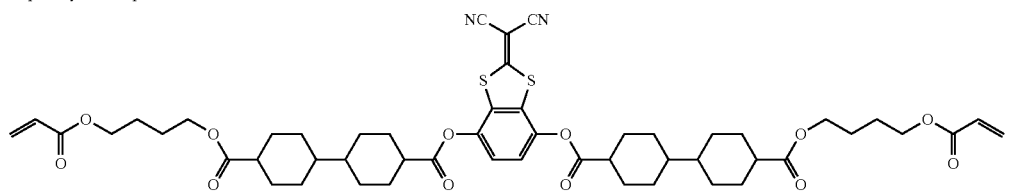

Liquid crystal compound L-2

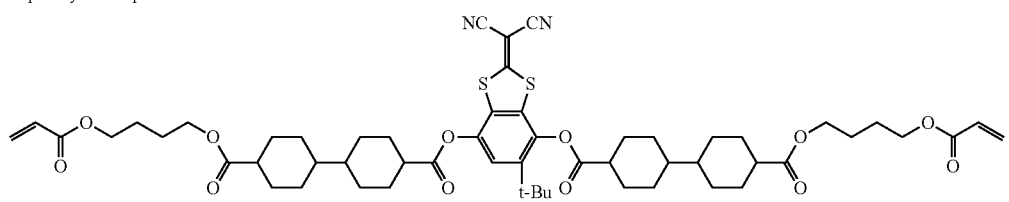

-continued
Liquid crystal compound L-3
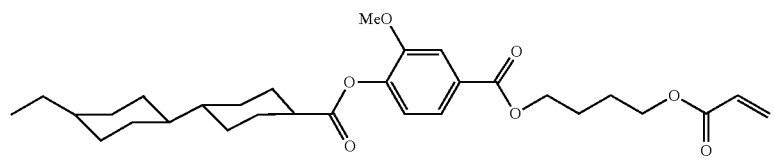 [SMILES: C=CC(=O)OCCCCOC(=O)c1ccc(OC(=O)C2CCC(C3CCC(CC)CC3)CC2)c(OC)c1]
Photopolymerization initiator FI-1
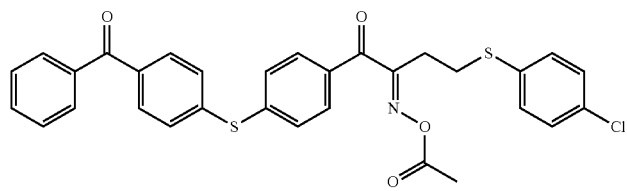 [SMILES: CC(=O)O/N=C(\CCSc1ccc(Cl)cc1)C(=O)c1ccc(Sc2ccc(C(=O)c3ccccc3)cc2)cc1]
Fluorine compound F-2
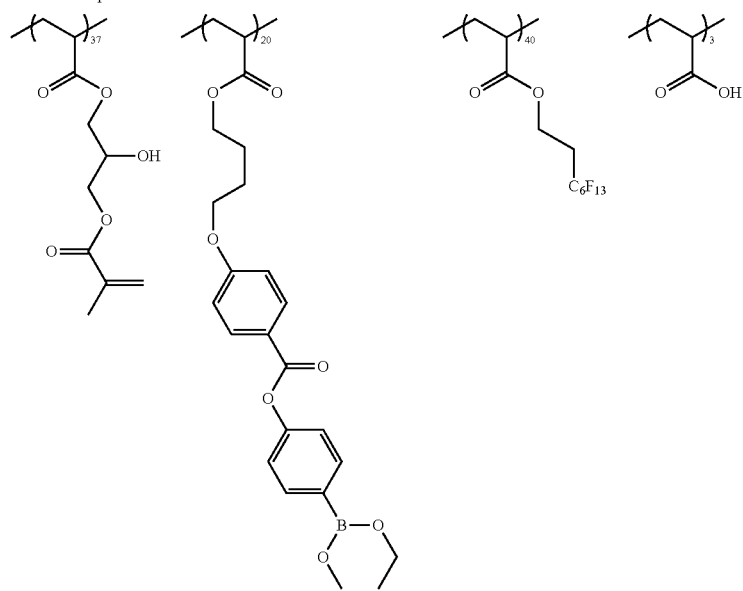
Monomer K1
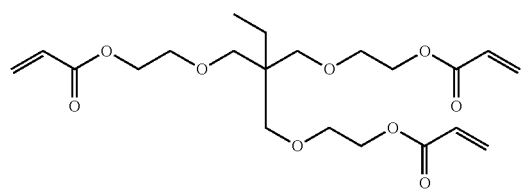 [SMILES: C=CC(=O)OCCOCC(CC)(COCCOC(=O)C=C)COCCOC(=O)C=C]
Additive A-1
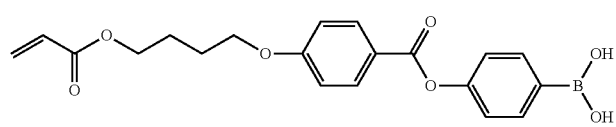

A coating liquid for an optically anisotropic film was applied onto the undercoat layer with a wire bar of #5.0 to form a coating film, which was heated at 80° C. for one minute and cooled to 25° C. Thereafter, nitrogen purge was performed so as to create an atmosphere with an oxygen concentration of 0.1% by volume or less, and the coating film was irradiated with ultraviolet rays at an irradiation dose of 500 mJ/cm² using a high-pressure mercury lamp to manufacture an optically anisotropic film (corresponding to the first embodiment). Further, the liquid crystal compound was vertically aligned by the treatment and fixed by a curing treatment.

The optical characteristics of the obtained optically anisotropic film were as follows: Rth(550) was −90 nm, Re(550) was 0 nm, Re(800) was 0 nm, Rth(450)/Rth(550) was 0.77, and Rth(650)/Rth(550) was 1.15.

In addition, an absorption in the infrared region at a polar angle of 45° was confirmed using a spectrophotometer (MPC-3100 (manufactured by SHIMADZU Corporation)) equipped with a polarizer for infrared rays, and it was thus confirmed that the absorption of S-polarized light was larger than the absorption of P-polarized light at a wavelength of 700 to 900 nm. The measurement of P-polarized light and S-polarized light was performed using a film to which the infrared absorbing coloring agent IR-1 had not been added, as a baseline. A ratio (S-polarized light intensity/P-polarized light intensity) of the absorption intensity in a case of irradiation with S-polarized light to the absorption intensity in a case of irradiation with P-polarized light at a wavelength having the largest absorption in a wavelength range of 700 to 900 nm was 1.12 (see FIG. 7).

Example 2

An optically anisotropic film (corresponding to the first embodiment) was obtained according to the same procedure as in Example 1, except that the amount of the infrared absorbing coloring agent IR-1 to be used was modified from 10 parts by mass to 5 parts by mass.

The optical characteristics of the obtained optically anisotropic film were as follows: Rth(550) was −93 nm, Re(550) was 0 nm, Re(800) was 0 nm, Rth(450)/Rth(550) was 0.79, and Rth(650)/Rth(550) was 1.07.

Figure 8:
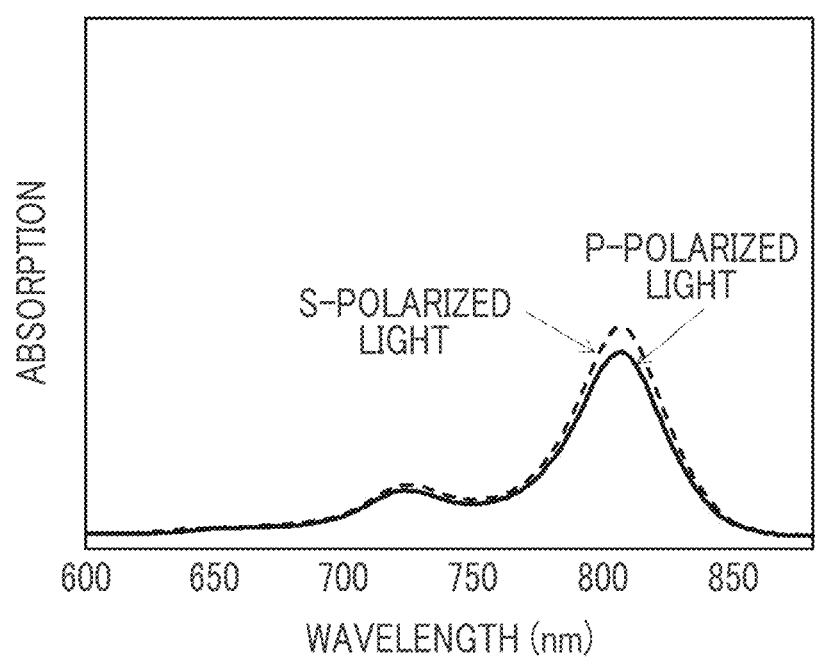
FIG. 8 is an absorption spectrum view in the infrared region at a polar angle of 45° in an optically anisotropic film of Example 2.

In addition, an absorption in the infrared region at a polar angle of 45° was confirmed using a spectrophotometer (MPC-3100 (manufactured by SHIMADZU Corporation)) equipped with a polarizer for infrared rays, and it was thus confirmed that the absorption of S-polarized light was larger than the absorption of P-polarized light at a wavelength of 700 to 900 nm. The measurement of P-polarized light and S-polarized light was performed using a film to which the infrared absorbing coloring agent IR-1 had not been added, as a baseline. A ratio (S-polarized light intensity/P-polarized light intensity) of the absorption intensity in a case of use of S-polarized light to the absorption intensity in a case of irradiation with P-polarized light at a wavelength having the largest absorption in a wavelength range of 700 to 900 nm was 1.11 (see FIG. 8).

Comparative Example 1

An optically anisotropic film was obtained according to the same procedure as in Example 1, except that the infrared absorbing coloring agent IR-1 was not used.

The optical characteristics of the obtained optically anisotropic film were as follows: Rth(550) was −96 nm, Re(550) was 0 nm, Re(800) was 0 nm, Rth(450)/Rth(550) was 0.80, and Rth(650)/Rth(550) was 1.02.

In addition, an absorption in the infrared region at a polar angle of 45° was confirmed using a spectrophotometer (MPC-3100 (manufactured by SHIMADZU Corporation)) equipped with a polarizer for infrared rays, and there was no absorption with any of S-polarized light and P-polarized light at a wavelength of 700 to 900 nm.

Example 3

The following coating liquid for an optically anisotropic film was prepared.

| | |
|---|---|
| The following liquid crystal compound L-1 | 43 parts by mass |
| The following liquid crystal compound L-2 | 43 parts by mass |
| The following liquid crystal compound L-4 | 14 parts by mass |
| Near-infrared absorbing coloring agent IR-1 | 5 parts by mass |
| The following photopolymerization initiator PI-1 | 0.50 parts by mass |
| The following fluorine-containing compound F-1 | 0.20 parts by mass |
| Chloroform | 535 parts by mass |

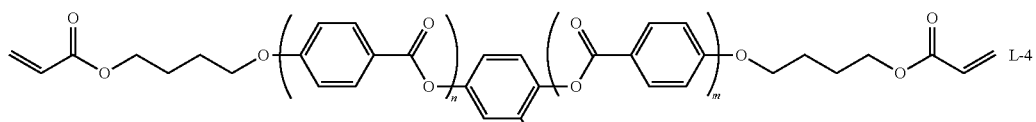

n, m = 1 or 2

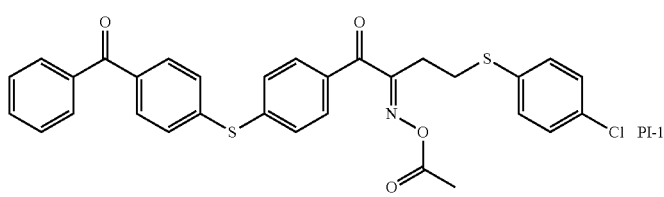

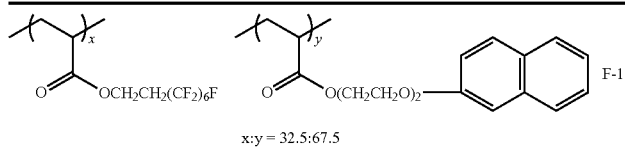

x:y = 32.5:67.5

A coating liquid for an optically anisotropic film was applied onto a glass substrate with a rubbed polyimide alignment layer (SE-130, manufactured by Nissan Chemical Corporation) by spin-coating to form a coating film, which was heated at 150° C. for one minute and then cooled to 60° C. Thereafter, nitrogen purge was performed so as to create an atmosphere with an oxygen concentration of 1.0% by volume or less, and the coating film was irradiated with ultraviolet rays at an irradiation dose of 500 mJ/cm$^2$ using a high-pressure mercury lamp to manufacture an optically anisotropic film W (corresponding to the second embodiment). Further, the liquid crystal compound was horizontally aligned by the treatment and fixed by a curing treatment.

The optical characteristics of the obtained optically anisotropic film W were measured using AxoScan OPMF-1 (manufactured by Opto Science, Inc.), and it was thus found that Re(550) was 140 nm, Re(450)/Re(550) was 0.83, and Re(650)/Re(550) was 1.08.

In addition, in a case where absorption in the infrared region was confirmed using a spectrophotometer (MPC-3100 (manufactured by SHIMADZU Corporation)) equipped with a polarizer for infrared rays, it was confirmed that a peak (maximum absorption wavelength: λmax) derived from the near-infrared absorbing coloring agent D-1 was exhibited at 799 nm. Further, it was confirmed that the absorption in a direction parallel to the fast axis of the optically anisotropic film W is larger than the absorption in a direction parallel to the slow axis at a wavelength of 700 to 900 nm.

In addition, the degree $S_0$ of alignment order of the optically anisotropic film 1 at the maximum absorption wavelength of the near-infrared absorbing coloring agent IR-1 was −0.28.

The optically anisotropic film W obtained above and the optically anisotropic film obtained in Example 1 were attached with each other via a pressure sensitive adhesive so that the longitudinal directions of the respective supports were aligned with each other, thereby manufacturing a laminate 1.

<Manufacture of Organic EL Display Device>

A polyvinyl alcohol film having a thickness of 80 µm was dyed by immersing the film in an aqueous iodine solution at an iodine concentration of 0.05% by mass at 30° C. for 60 seconds. Subsequently, the obtained film was vertically stretched five times its original length while the film was immersed in an aqueous boric acid solution (boric acid concentration: 4% by mass) for 60 seconds, and then the vertically stretched film was dried at 50° C. for 4 minutes to obtain a polarizer having a thickness of 20 µm.

A commercially available cellulose acylate-based film "TD80UL" (manufactured by FUJIFILM Corporation) was prepared and immersed in an aqueous sodium hydroxide solution at 1.5 mol/liter at 55° C., and then the obtained film was sufficiently washed with water to remove sodium hydroxide.

Thereafter, the obtained film was immersed in a diluted aqueous sulfuric acid solution at 0.005 mol/liter at 35° C. for one minute, then the obtained film was immersed in water, and the diluted aqueous sulfuric acid solution on the film was sufficiently washed off. Thereafter, the washed film was dried at 120° C. to manufacture a protective film for a polarizer.

The protective film for a polarizer manufactured above was bonded to one surface of the polarizer manufactured above with a polyvinyl alcohol-based adhesive to manufacture a polarizing plate including the polarizer and the protective film for a polarizer arranged on one surface of the polarizer.

A pressure sensitive adhesive (SK-2057, manufactured by Soken Chemical & Engineering Co., Ltd.) was applied onto the polarizer (having no protective film for a polarizer) side in the polarizing plate manufactured above to form a pressure sensitive adhesive layer, and the laminate 1 manufactured above was bonded thereto, thereby manufacturing a circularly polarizing plate. Furthermore, the angle formed by the slow axis of the laminate (in other words, the slow axis of the optically anisotropic film W) and the transmission axis of the polarizer was set to 45°.

Galaxy S4 (manufactured by Samsung) was disintegrated and a part of an antireflection film bonded to the product was peeled and used as a light emitting layer. The circularly polarizing plate manufactured above was bonded to the light emitting layer via a pressure sensitive adhesive while preventing air permeation, thereby manufacturing an organic electroluminescence (EL) display device.

Production Example A1

A polyimide alignment film SE-130 (manufactured by Nissan Chemical Corporation) was applied onto a washed glass substrate by a spin coating method. After the coating film was dried and then calcined at 250° C. for 1 hour, the coating film was subjected to a rubbing treatment to form an alignment layer.

The following coating liquid for an optically anisotropic film was prepared.

| | |
|---|---|
| The following liquid crystal compound L-5 | 100 parts by mass |
| Infrared absorbing coloring agent IR-2 | 10 parts by mass |
| The photopolymerization initiator PI-1 | 2.0 parts by mass |
| The fluorine-containing compound F-1 | 1.0 part by mass |
| Chloroform | 571.8 parts by mass |

Moreover, a group adjacent to the acryloyloxy group in the structural formulae of the liquid crystal compound L-5 and the infrared absorbing coloring agent IR-2 represents a propylene group (a group in which the methyl group is substituted with an ethylene group), and the following liquid crystal compound L-5 and the infrared absorbing coloring agent IR-2 represent a mixture of position isomers in which the positions of the methyl groups are different.

Liquid crystal compound L-5 (hereinafter a structural formula thereof is shown)

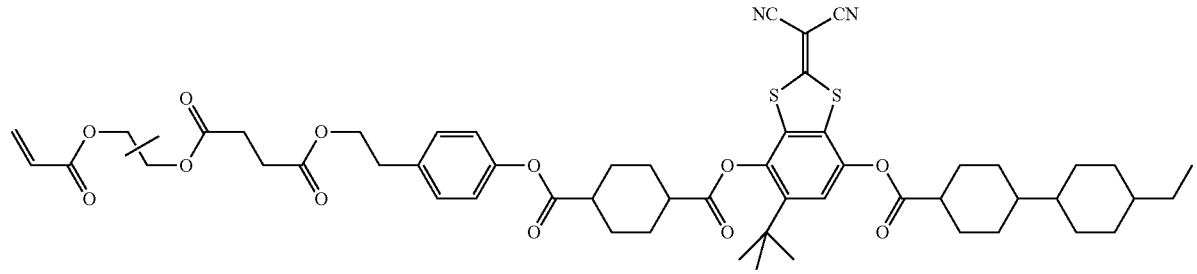

Infrared absorbing coloring agent IR-2 (hereinafter a structural formula thereof is shown)

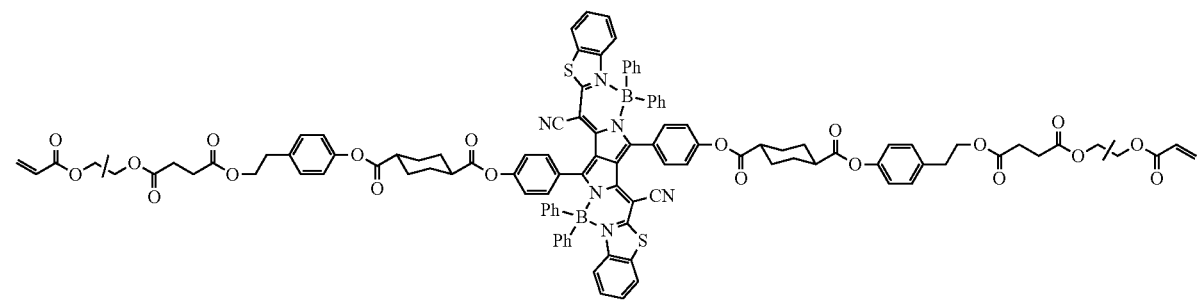

The coating liquid for an optically anisotropic film was applied onto the alignment layer by a spin coating method to form a coating film, and the coating film was heated at 120° C. for one minute and cooled to 60° C.

Thereafter, nitrogen purge was performed so as to create an atmosphere with an oxygen concentration of 1.0% by volume or less, and the coating film was irradiated with ultraviolet rays at an irradiation dose of 500 mJ/cm$^2$ using a high-pressure mercury lamp to manufacture an optically anisotropic film (corresponding to the second embodiment). Further, the liquid crystal compound was horizontally aligned by the treatment and fixed by a curing treatment.

The optical characteristics of the obtained optically anisotropic film were measured using AxoScan OPMF-1 (manufactured by Opto Science, Inc.), and it was thus found that Re(550) was 140 nm, Re(450)/Re(550) was 0.78, and Re(650)/Re(550) was 1.25.

In addition, an absorption in the infrared region was confirmed using a spectrophotometer (MPC-3100 (manufactured by SHIMADZU Corporation)) equipped with a polarizer for infrared rays, and it was thus confirmed that the absorption in the direction in parallel with the fast axis of the optically anisotropic film was larger than the absorption in the direction in parallel with the slow axis at a wavelength of 700 to 900 nm.

In addition, the degree $S_0$ of alignment order of the optically anisotropic film at the maximum absorption wavelength of the infrared absorbing coloring agent IR-2 was −0.25.

Production Examples A2 to A5

An optically anisotropic film (corresponding to the second embodiment) was manufactured according to the same procedure as in Production Example A1, except that the type of the liquid crystal compound and the amount thereof to be used, the type of the infrared absorbing coloring agent and the amount thereof to be used, the amount of the photopolymerization initiator S-1 to be used, the amount of the fluorine-containing compound F-1 to be used, and the heating condition and cooling condition upon formation of the coating film were changed as in Table 1.

Re(550), Re(450)/Re(550), Re(650)/Re(550), and the degree $S_0$ of alignment order of the obtained optically anisotropic film are summarized in Table 1.

Furthermore, with regard to the optically anisotropic film obtained in each of Production Examples A2 to A5, an absorption in the infrared region was confirmed using a spectrophotometer (MPC-3100 (manufactured by SHIMADZU Corporation)) equipped with a polarizer for infrared rays, and it was thus confirmed that the absorption in the direction in parallel with the fast axis of the optically anisotropic film was larger than the absorption in the direction in parallel with the slow axis at a wavelength of 700 to 900 nm.

Furthermore, the liquid crystal compounds and infrared absorbing coloring agents in Table 1 are as follows.

Liquid crystal compound L-6 (hereinafter a structural formula thereof is shown)

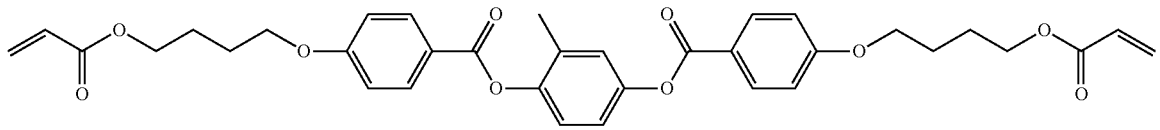 [SMILES: C=CC(=O)OCCCCOc1ccc(C(=O)Oc2ccc(OC(=O)c3ccc(OCCCCOC(=O)C=C)cc3)c(C)c2)cc1]

Infrared absorbing coloring agent IR-3 (hereinafter a structural formula thereof is shown)

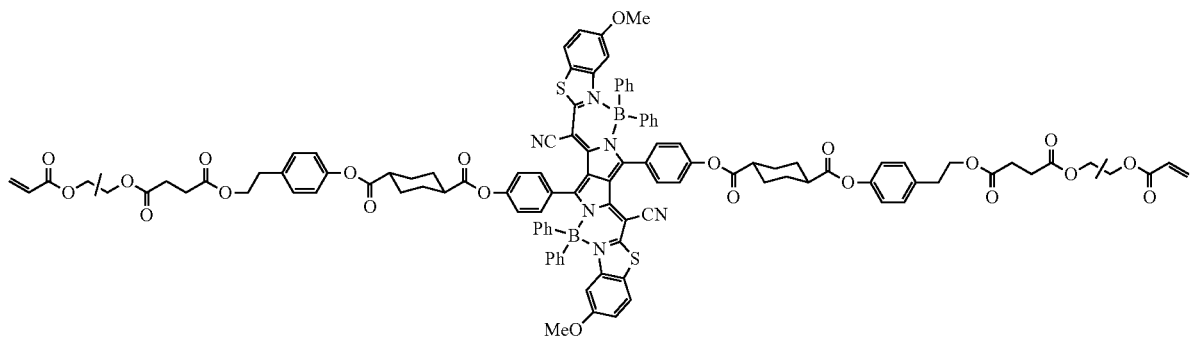

Moreover, a group adjacent to the acryloyloxy group in the structural formula of the infrared absorbing coloring agent IR-3 represents a propylene group (a group in which the methyl group is substituted with an ethylene group), and the infrared absorbing coloring agent IR-3 represents a mixture of position isomers in which the positions of the methyl groups are different.

Moreover, infrared absorbing coloring agents IR-2 and IR-3 were synthesized with reference to <Synthesis of Coloring Agent>above.

The infrared absorbing coloring agent IR-2 and the infrared absorbing coloring agent IR-3 were each dissolved in chloroform at a concentration of $10^{-4}$ mol/l, and a solution thus obtained was used to measure spectral characteristics. In addition, a spectrophotometer (MPC-3100 manufactured by SHIMADZU Corporation) was used for the measurement.

A maximum absorption wavelength of the infrared absorbing coloring agent IR-2 was 785 nm and a maximum absorption wavelength of the infrared absorbing coloring agent IR-3 was 800 nm.

An integrated value of the absorbances in a wavelength range of 700 to 900 nm of the infrared absorbing coloring agent IR-2 was larger than an integrated value of the absorbances in a wavelength range of 400 to 700 nm of the infrared absorbing coloring agent IR-2.

An integrated value of the absorbances in a wavelength range of 700 to 900 nm of the infrared absorbing coloring agent IR-3 was larger than an integrated value of the absorbances in a wavelength range of 400 to 700 nm of the infrared absorbing coloring agent IR-3.

TABLE 1

| | Liquid crystal compound | | | Infrared absorbing coloring agent | Fluorine compound F-1 Amount thereof to be used | Photopolymerization initiator PI-1 Amount thereof to be used | Conditions for forming coating film | | Optical characteristics | | |
|---|---|---|---|---|---|---|---|---|---|---|---|
| | Type | Type | Type | | | | Heating | Cooling | Re(550) | Re(550)/ | Re(650)/ |
| | (parts by mass) | (parts by mass) | (parts by mass) | (parts by mass) | (parts by mass) | (parts by mass) | temperature | temperature | (nm) | Re(550) | Re(550) | $S_0$ |
| Production Example A1 | L-5 (100) | — | — | IR-2 (10) | 1 | 2 | 120° C. | 60° C. | 140 | 0.78 | 1.25 | −0.25 |
| Example A2 | L-5 (100) | — | — | IR-2 (10) | 1 | 2 | 200° C. | 60° C. | 140 | 0.80 | 1.16 | −0.15 |
| Example A3 | L-5 (100) | — | — | IR-2 (5) | 1 | 2 | 100° C. | 60° C. | 140 | 0.78 | 1.17 | −0.22 |
| Example A4 | L-1 (42) | L-2 (42) | L-6 (16) | IR-3 (5) | 0.2 | 0.5 | 240° C. | 120° C. | 140 | 0.82 | 1.13 | −0.29 |

The optically anisotropic film obtained in each of Production Examples A2 to A4 and the optically anisotropic film obtained in Example 1 were attached with each other via a pressure sensitive adhesive so that the longitudinal directions of the respective supports were aligned with each other, thereby manufacturing a laminate.

The obtained laminate was used instead of the laminate 1 in <Manufacture of Organic EL Display Device> to manufacture an organic EL display device.

What is claimed is:

1. An optically anisotropic film satisfying the following Requirements 1 to 4:
    Requirement 1: in a case of irradiation with P-polarized light and S-polarized light, which are linearly polarized light perpendicular to each other, from a direction inclined by 45° from a normal direction of a film surface of the optically anisotropic film, an absorption intensity ratio in a case of irradiation with S-polarized light to an absorption intensity in a case of irradiation with P-polarized light is 1.02 or more in an absorption intensity at a wavelength having a largest absorption in a wavelength range of 700 to 900 nm,
    Requirement 2: Re(550)<10 nm,
    Requirement 3: Re(800)<10 nm, and
    Requirement 4: Rth(450)/Rth(550)<1,
    in the formulae, Rth(450) represents a thickness-direction retardation of the optically anisotropic film at a wavelength of 450 nm, Rth(550) represents a thickness-direction retardation of the optically anisotropic film at a wavelength of 550 nm, and Re(550) represents an in-plane retardation of the optically anisotropic film at a wavelength of 550 nm.

2. The optically anisotropic film according to claim 1, wherein the optically anisotropic film is formed of a composition including a liquid crystal compound or a polymer, and an infrared absorbing coloring agent.

3. The optically anisotropic film according to claim 2, wherein the infrared absorbing coloring agent is a compound represented by Formula (1),

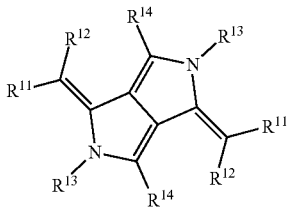

Formula (1)

in the formula, $R^{11}$ and $R^{12}$ each independently represent a hydrogen atom or a substituent, at least one of $R^{11}$ or $R^{12}$ is an electron-withdrawing group, and $R^{11}$ and $R^{12}$ may be bonded to each other to form a ring, $R^{13}$'s each independently represent a hydrogen atom, an alkyl group, an aryl group, a heteroaryl group, a substitutional boron, or a metal atom, and may be covalently bonded or coordinately bonded with $R^{11}$, and $R^{14}$'s each independently represent a group having a mesogenic group.

4. The optically anisotropic film according to claim 1, wherein a liquid crystal compound is included, and the liquid crystal compound is vertically aligned and thus fixed.

5. A laminate comprising:
    the optically anisotropic film according to claim 1; and
    another optically anisotropic film different from the optically anisotropic film.

6. The laminate according to claim 5, wherein the other optically anisotropic film is a λ/4 plate.

7. A circularly polarizing plate comprising:
    the optically anisotropic film according to claim 1;
    a λ/4 plate; and
    a polarizer.

8. A display device comprising:
    a display element; and
    the optically anisotropic film according to claim 1, arranged on the display element.

9. The optically anisotropic film according to claim 2, wherein a liquid crystal compound is included, and the liquid crystal compound is vertically aligned and thus fixed.

10. A laminate comprising:
    the optically anisotropic film according to claim 2; and
    another optically anisotropic film different from the optically anisotropic film.

11. The laminate according to claim 10, wherein the other optically anisotropic film is a λ/4 plate.

12. A circularly polarizing plate comprising:
    the optically anisotropic film according to claim 2;
    a λ/4 plate; and
    a polarizer.

13. A display device comprising:
    a display element; and
    the optically anisotropic film according to claim 2, arranged on the display element.

14. The optically anisotropic film according to claim 3, wherein a liquid crystal compound is included, and the liquid crystal compound is vertically aligned and thus fixed.

15. A laminate comprising:
    the optically anisotropic film according to claim 3; and
    another optically anisotropic film different from the optically anisotropic film.

16. The laminate according to claim 15, wherein the other optically anisotropic film is a λ/4 plate.

17. A circularly polarizing plate comprising:
    the optically anisotropic film according to claim 3;
    a λ/4 plate; and
    a polarizer.

18. A display device comprising:
    a display element; and
    the optically anisotropic film according to claim 3, arranged on the display element.

19. A laminate comprising:
    the optically anisotropic film according to claim 4; and
    another optically anisotropic film different from the optically anisotropic film.

20. The laminate according to claim 19, wherein the other optically anisotropic film is a λ/4 plate.

* * * * *